US008990742B2

(12) United States Patent
Turner et al.

(10) Patent No.: US 8,990,742 B2
(45) Date of Patent: Mar. 24, 2015

(54) NETWORK SYNTHESIS DESIGN OF MICROWAVE ACOUSTIC WAVE FILTERS

(71) Applicant: Resonant LLC, Santa Barbara, CA (US)

(72) Inventors: Patrick J. Turner, Santa Barbara, CA (US); Richard N. Silver, San Francisco, CA (US); Balam Quitze Andres Willemsen Cortes, Lexington, MA (US); Kurt F. Raihn, Goleta, CA (US); Neal O. Fenzi, Santa Barbara, CA (US); Robert B. Hammond, Santa Barbara, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 14/214,562

(22) Filed: Mar. 14, 2014

(65) Prior Publication Data

US 2014/0282311 A1    Sep. 18, 2014

Related U.S. Application Data

(63) Continuation-in-part of application No. 13/838,943, filed on Mar. 15, 2013.

(51) Int. Cl.
*G06F 17/50* (2006.01)
*H03H 9/46* (2006.01)
*H03H 9/54* (2006.01)

(52) U.S. Cl.
CPC ........... *G06F 17/505* (2013.01); *H03H 9/46* (2013.01); *H03H 9/465* (2013.01); *H03H 9/542* (2013.01)
USPC .......................................................... 716/104

(58) Field of Classification Search
USPC .......................................................... 716/104
See application file for complete search history.

(56) References Cited

U.S. PATENT DOCUMENTS 1,795,204 A    3/1931    Espenschied
1,989,545 A    1/1935    Cauer
(Continued)

FOREIGN PATENT DOCUMENTS

WO    WO 2007/073524    6/2007

OTHER PUBLICATIONS

Aeroflex, Application Note, Intermodulation Distortion, Part No. 46801, Issue 2, May 2004, (12 pages).
(Continued)

*Primary Examiner* — Suresh Memula
(74) *Attorney, Agent, or Firm* — Vista IP Law Group LLP

(57) ABSTRACT

A method of designing an acoustic microwave filter in accordance with frequency response requirements. The method comprises selecting an initial filter circuit structure including a plurality of circuit elements comprising at least one resonant element and at least one other reactive circuit element, selecting lossless circuit response variables based on the frequency response requirements, selecting a value for each of the circuit elements based on the selected circuit response variables to create an initial filter circuit design, transforming the resonant element(s) and the other reactive circuit element(s) of the initial filter circuit design into at least one acoustic resonator model to create an acoustic filter circuit design, adding parasitic effects to the acoustic filter circuit design to create a pre-optimized filter circuit design, optimizing the pre-optimized filter circuit design to create a final filter circuit design, and constructing the acoustic microwave filter based on the final filter circuit design.

25 Claims, 29 Drawing Sheets

(56) References Cited

U.S. PATENT DOCUMENTS

| | | | |
|---|---|---|---|
| 5,905,418 | A | 5/1999 | Ehara et al. |
| 6,677,835 | B2 | 1/2004 | Noguchi et al. |
| 7,639,101 | B2 | 12/2009 | Tsuzuki et al. |
| 7,719,382 | B2 | 5/2010 | Tsuzuki et al. |
| 7,863,999 | B2 | 1/2011 | Tsuzuki et al. |
| 7,924,114 | B2 | 4/2011 | Tsuzuki et al. |
| 8,026,776 | B2 | 9/2011 | Ueda et al. |
| 8,063,714 | B2 | 11/2011 | Tsuzuki et al. |
| 8,063,717 | B2 | 11/2011 | Bradley et al. |
| RE43,958 | E | 2/2013 | Noguchi et al. |
| 2001/0052739 | A1* | 12/2001 | Milsom .................. 310/366 |
| 2009/0002102 | A1 | 1/2009 | Tsuzuki et al. |
| 2009/0121802 | A1* | 5/2009 | Tsuzuki et al. .............. 333/17.1 |
| 2012/0119847 | A1 | 5/2012 | Iwaki et al. |
| 2012/0293279 | A1* | 11/2012 | Gong et al. .................. 333/202 |
| 2013/0093538 | A1 | 4/2013 | Hirota et al. |

OTHER PUBLICATIONS

Amari, Synthesis of Cross-Coupled Resonator Filters Using an Analytical Gradient-Based Optimization Technique, IEEE Trans. Microwave Theory & Technique, Sep. 2000, vol. 48, No. 9, pp. 1559-1564.
Amari et al., In-Line Pseudoelliptic Band-Reject Filters with Nonresonating Notes and/or Phase Shifts, IEEE Transactions on Microwave Theory & Techniques, vol. 54, No. 1, Jan. 2006, pp. 428-436.
Anritsu, Intermodulation Distortion (IMD) Measurements Using the 37300 Se,ries Vector Network Analyzer, Application Note, Sep. 2000, Rev. A, pp. 1-12.
Dahm, et al., Analysis & Optimization of Intermodulation in High-T.Superconducting Microwave Filter Design, IEEE Transactions on Applied Superconductivity, vol. 8, No. 4, Dec. 1998, pp. 149-157.
Hey-Shipton, Efficient Computer Design of Compact Planar Band-Pass Filters Using Electrically Short Multiple Coupled Unes,1999 IEEE MTT-S Int. Microwave Symp. Dig. (4 pages).
Hong, et al., Microstrip Filters for RF/Microwave Applications, John Wiley & Sons, Inc. 2001, Table of Contents, pp. 1-471.
Liang et al., HTS Microstrip Filters with Multiple Symmetric & Asymmetric Prescribed Transmission Zeros,1999, IEEE MTT-S Digest, pp. 1551-1554.
Tsuzuki, et al., Superconducting Filter for IMT-2000 Band, IEEE Transactions on Microwave Theory & Techniques, vol. 48, No. 12, Dec. 2000, pp. 2519-2525.
Wu, et al., New Cross-Coupled Microstrip Band Reject Filters, 20041EEE MTT-S Digest, pp. 1597-1600.
U.S. Appl. No. 61/802,114, entitled Element Removal Design in Microwave Filters, Inventor: Neal Fenzi et al., filed Mar. 15, 2013.
Zobel, Otto J., Theory and Design of Uniform and Composite Electric Wave-filters, The Bell System Technical Journal, vol. II, No. 1 (Jan. 1923).
Campbell, G. A., Physical Theory of the Electric Wave Filter, The Bell System Technical Journal, vol. I, No. 2 (Nov. 1922).
Darlington, S., Synthesis of Reactance 4-poles which produce prescribed insertion loss characteristics, J. Math Phys, vol. 18, 1939, pp. 257-353.
Foster, R.M., A Reactance Theorem, Bell Syst. Tech. J., vol. 3, 1924, pp. 259-267.
Hashimoto, K., Surface Acoustic Wave Devices in Telecommunications: Modeling and Simulation, Springer (2000), pp. 149-161.
IKATA, O. et al., Development of Low-Loss Bandpass Filters Using Saw Resonators for Portable Telephones, 1992 Ultrasonics Symposium, pp. 111-115.
Kinsman, R.G., Crystal Filters: Design, Manufacture, and Application, John Wiley & Sons, pp. 37-105 and 117-155, (1987).
Mason, W.P., Electrical Wave Filters Employing Quartz Crystals as Elements, The Bell System Technical Journal (1934)).
Matthaei, G.L. et al., Microwave Filters, Impedance-Matching Networks, and Coupling Structures, McGraw-Hill Book Company, pp. 95-97, 438-440 (1964).
Morgan, D., Surface Acoustic Wave Filters With Applications to Electronic Communications and Signal Processing, pp. 335-339, 352-354 (2007).
Van Dyke, K.S., Piezo-Electric Resonator and its Equivalent Network, Proc. IRE, vol. 16, 1928, pp. 742-764.
Zverev, A. I., Handbook of Filter Synthesis, John Wiley & Sons, pp. 414-498 (1967).
Saboureau, Cedrick et al., Accurate Computer Aided Design of Interdigital Filters Applying a Coupling Identification Method, 2002 IEEE MTT-S International Microwave Symposium Digest (CAT. No. 02CH37278) IEEE Piscataway, NJ, USA; [IEEE Mtt-S International Microwave Symposium], IEEE, Jun. 2, 2002, pp. 2089-2092, XP032408674, DOI: 10.1109/mwsym.2002.1012281, ISBN: 978-0/7803-7239-3 (4pages).
Wang, Hualei et al., Design of narrow bandwidth elliptic-type SAW/BAW filters, Electronic Letters, May 10, 2012, vol. 48, No. 10 (2pages).
PCT International Search Report for PCT/US2014/029800, Applicant: Resonant LLC, Form PCT/ISA/210 and 220, dated Sep. 18, 2014 (7pages).
PCT Written Opinion of the International Search Authority for PCT/US2014/029800, Applicant: Resonant LLC, Form PCT/ISA/237, dated Sep. 18, 2014 (9pages).
Cameron, Richard et al., Microwave Filters for Communication Systems: Fundamentals, Designs and Applications, Wiley-Interscience (2007), Chapter 2, pp. 83-96.
Cameron, Richard et al., Microwave Filters for Communication Systems: Fundamentals, Designs and Applications, Wiley-Interscience (2007), Chapter 3, pp. 97-150.
Cameron, Richard et al., Microwave Filters for Communication Systems: Fundamentals, Designs and Applications, Wiley-Interscience (2007), Chapter 7, pp. 243-278.

* cited by examiner

| Element | Ind (nH) | Element | Cap (pF) | Element | CO (pF) | Fres (MHz) |
|---------|----------|---------|----------|---------|---------|------------|
| L1 | 9.05 | C1 | 2.45 | Res1 | 1.96 | 1858.13 |
| L2 | 1.43 | C2 | 0.89 | Res2 | 0.84 | 1825.00 |
| L3 | 0.38 | C3 | 0.14 | Res3 | 0.31 | 1881.19 |
| L4 | 11.93 | | | Res4 | 0.61 | 1831.00 |
| L5 | 0.09 | | | Res5 | 0.89 | 1910.00 |
| L6 | 63.42 | | | Res6 | 0.16 | 2150.00 |
| L7 | 7.18 | | | Res7 | 0.54 | 2032.00 |
| L8 | 0.21 | | | Res8 | 4.42 | 1797.00 |
| | | | | Res9 | 4.69 | 1852.36 |

FIG. 16

| Element | C0 (pF) | Fres (MHz) |
|---------|---------|------------|
| Res1 | 6.51 | 1854.78 |
| Res2 | 2.93 | 1792.20 |
| Res3 | 0.81 | 1877.00 |
| Res4 | 3.48 | 1800.00 |
| Res5 | 1.13 | 1866.30 |
| Res6 | 0.61 | 2151.57 |
| Res7 | 6.14 | 2026.79 |
| Res8 | 1.63 | 1806.38 |
| Res9 | 1.74 | 1867.06 |

FIG. 19

| Element | Ind(nH) | Element Cap | (pF) | Element Co | (pF) | Fres (MHz) | Element | (mm) |
|---|---|---|---|---|---|---|---|---|
| L1 | 8.3 | C1 | 0.85 | Res1 | 0.95 | 929.02 | S1 | 3.3 |
| L2 | 7.9 | C2 | 3.80 | Res2 | 0.95 | 870.21 | S2 | 4.0 |
| L3 | 5.7 | C3 | 0.27 | Res3 | 0.97 | 924.11 | S3 | 4.0 |
| L4 | 2.4 | C4 | 4.60 | Res4 | 1.79 | 787.07 | S4 | 4.0 |
| L5 | 15.3 | C5 | 3.90 | Res5 | 4.51 | 800.95 | S5 | 4.0 |
| L6 | 12.6 | | | Res6 | 0.95 | 947.94 | S6 | 4.0 |
| L7 | 13.0 | | | | | | S7 | 3.3 |
| L8 | 13.6 | | | | | | | |

FIG. 27

NETWORK SYNTHESIS DESIGN OF MICROWAVE ACOUSTIC WAVE FILTERS

RELATED APPLICATION DATA

This application is a continuation-in-part of U.S. patent application Ser. No. 13/838,943, filed Mar. 15, 2013, which application is all incorporated herein by reference in its entirety.

FIELD OF THE INVENTION

The present inventions generally relate to microwave filters, and more particularly, to acoustic wave microwave filters.

BACKGROUND OF THE INVENTION

Low loss, frequency selective electrical signal filters for communications applications were developed beginning around 1910, for telegraphy and telephony uses, particularly for multiplexing and de-multiplexing of communication signal channels carried on long distance cables and wireless links. Filter design methods, named "image" or "image parameter" design methods, were developed by Bell Laboratories, among others (see George A. Campbell, "Physical Theory of the Electric Wave Filter", The Bell System Technical Journal, Volume I, No. 2 (November 1922); Otto J. Zobel, "Theory and Design of Uniform and Composite Electric Wave-Filters", The Bell System Technical Journal, Volume II, No. 1 (January 1923)). These filter circuits utilized circuit elements, including inductors, capacitors, and transformers.

In the 1920s, Acoustic Wave (AW) resonators, specifically quartz bulk acoustic wave (BAW) resonators, began to be used in some electrical signal filters. The equivalent circuit of an AW resonator has two resonances closely spaced in frequency called the "resonance" frequency and the "anti-resonance" frequency (see K. S. Van Dyke, "Piezo-Electric Resonator and its Equivalent Network" Proc. IRE, Vol. 16, 1928, pp. 742-764). The image filter design methods were applied to filter circuits utilizing these quartz resonators, and two AW filter circuit types resulted: "ladder" and "lattice" AW filter designs (see L. Espenschied, Electrical Wave Filter, U.S. Pat. No. 1,795,204; and W. P. Mason, "Electrical Wave Filters Employing Quartz Crystals as Elements", The Bell System Technical Journal (1934)).

In the 1920s and 1930s, another approach, which came to be referred to as "network synthesis," was developed for the design of frequency selective electrical signal filters for communications applications. This new filter circuit design method was pioneered by Foster and Darlington in the United States (see Ronald M. Foster, "A Reactance Theorem," Bell Syst. Tech. J., Vol 3, 1924, pp. 259-267, and S. Darlington, "Synthesis of Reactance 4-poles which produce prescribed insertion loss characteristics", J. Math Phys, Vol 18, 1939, pp. 257-353.) and Cauer in Germany (see W. Cauer, U.S. Pat. No. 1,989,545; 1935) among others.

In "network synthesis," after an initial circuit structure is chosen, which includes circuit element types and the way they are interconnected, the desired loss-less filter response is translated into a ratio of complex polynomials in the form of complex frequency dependent circuit response parameters such as scattering parameters, e.g. S21 and S11. The S21 scattering parameter may be represented as follows:

$$H(s) = \frac{N(s)}{D(s)} = K \frac{(s-z_1)(s-z_2) \ldots (s-z_{m-1})(s-z_m)}{(s-p_1)(s-p_2) \ldots (s-p_{n-1})(s-p_n)}, \quad [1]$$

where N(s) is the numerator polynomial, D(s) is the denominator polynomial, the $z_i$'s are the roots (or transmission zeroes) of the equation N(s)=0, the $p_i$'s are the roots (or reflection zeroes) of the equation D(s)=0, m is the number of transmission zeroes, and n is the number of reflection zeroes, and K is a scale factor. (Note: transmission zeroes are the zeroes of S21 and reflection zeroes are the zeroes of S11, for the loss-less case. When the small but finite real losses are added later in the circuit design process these zeroes may become small but no longer precisely zero, and correspond to the natural frequencies, resonances, of the final filter.) The filter circuit element values may then be "synthesized" (calculated) exactly in the loss-less case from the ratio of complex polynomials. Neglecting losses, which are kept small in practice, the response of the "synthesized" circuit matches the desired response function.

In the 1950s and 1960s, network synthesis was successfully applied to the design of microwave filters for communications and other applications. These new filters utilize high Q (low loss) electromagnetic resonators and electromagnetic couplings between these resonators as circuit elements (see George L. Matthaei et al., Microwave Filters, Impedance-Matching Networks, and Coupling Structures, McGraw-Hill Book Company, pp. 95-97, 438-440 (1964); and Richard J. Cameron et al., Microwave Filters for Communication Systems: Fundamentals, Design and Applications, Wiley-Interscience (2007).). Network synthesis was also applied to the design of acoustic wave filters for communications and other applications beginning in the 1960's. (See Anatol I. Zverev, Handbook of Filter Synthesis, John Wiley & Sons, pp. 414-498 (1967); and Robert G. Kinsman, Crystal Filters: Design, Manufacture, and Application, John Wiley & Sons, pp. 37-105 and 117-155, (1987).) In this work, only the resonance of the acoustic wave resonator is included in the initial circuit structure. The anti-resonance is treated as a parasitic effect added into the circuit after the element values of the initial circuit are calculated by the network synthesis method.

Beginning in about 1992, thin film surface acoustic wave (SAW) resonators and thin film BAW resonators were developed and began to be used at microwave frequencies (>500 MHz). AW impedance element filter (IEF) designs, were utilized which is an example of an Espenschied-type ladder acoustic wave filter design (see 0. Ikata, et al., "Development of Low-Loss Bandpass Filters Using Saw Resonators for Portable Telephones", 1992 Ultrasonics Symposium, pp. 111-115; and Ken-ya Hashimoto, Surface Acoustic Wave Devices in Telecommunications: Modeling and Simulation, Springer (2000), pp. 149-161). Image designed AW IEF bandpass filters in SAW and BAW implementations are often used for microwave filtering applications in the radio frequency (RF) front end of mobile communications devices. Of most particular importance in the mobile communication industry is the frequency range from approximately 500-3, 500 MHz. In the United States, there are a number of standard bands used for cellular communications. These include Band 2 (~1800-1900 MHz), Band 4 (~1700-2100 MHz), Band 5 (~800-900 MHz), Band 13 (~700-800 MHz), and Band 17 (~700-800 MHz); with other bands emerging.

The duplexer, a specialized kind of filter, is a key component in the front end of mobile devices. Modern mobile communications devices transmit and receive at the same time (using Code Division Multiple Access (CDMA), Wide-Band Code Division Multiple Access (WCDMA), or Long Term Evolution (LTE)) and use the same antenna. The duplexer separates the transmit signal, which can be up to 0.5 Watt power, from the receive signal, which can be as low as a pico-Watt. The transmit and receive signals are modulated on carriers at different frequencies allowing the duplexer to select them; even so the duplexer must provide low insertion loss, high selectively, small circuit area, high power handling, high linearity, and low cost. The image designed bandpass AW IEF filter is universally preferred to be used in a duplexer, because it satisfies these requirements, and significantly better than alternatives like the tapped delay line (since it has higher loss), and the resonant single-phase unidirectional transducer (SPUDT) filter (since the narrow lines required prevent scaling to microwave frequencies); although the double-mode SAW (DMS) (also called longitudinally coupled resonator (LCR)) filter is sometimes used for the receive filter in a duplexer due to the balanced output it provides and improved rejection. (See David Morgan, Surface Acoustic Wave Filters With Applications to Electronic Communications and Signal Processing, pp. 335-339, 352-354 (2007)).

Minor variations to these traditional AW IEF filter designs have also been considered for these applications (see, for example, U.S. Pat. No. 8,026,776 and U.S. Pat. No. 8,063,717), which typically add one or more circuit elements (e.g. capacitor, inductor, or AW resonator) to the IEF design to enhance or add a particular circuit feature. This can be accomplished when the influences to the AW IEF circuit are minor enough that currently used computer optimization tools converge and produce an improved design after the additional element(s) are added, as compared to the optimized IEF. This is a stringent requirement for any circuit containing AW resonators, with their closely spaced resonances and anti-resonances, and thus permits only very minor variations to the basic AW IEF design and function.

There is a need for improved microwave acoustic wave filters to provide improved performance, smaller size, and lower cost; as well as to incorporate tunability. Network synthesis offers a path when the compound nature of the acoustic wave resonator is incorporated directly into the network synthesis process—the subject of this invention.

SUMMARY OF THE INVENTION

In accordance with the present inventions, a method of designing an acoustic microwave filter in accordance with frequency response requirements (e.g., one or more of a frequency dependent return loss, insertion loss, rejection, and linearity or a passband (e.g., in 500-3500 MHz range) and a stop band) is provided. The method comprises selecting an initial filter circuit structure including a plurality of circuit elements comprising at least one resonant element (e.g., a parallel L-C resonator combination of a capacitor and an inductor) and at least one other reactive circuit element (e.g., a capacitor). The initial filter circuit structure can be, e.g., an in-line non-resonant-node circuit structure.

An optional method further comprises selecting the structural type of each of the resonant element(s) from one of a surface acoustic wave (SAW) resonator, a bulk acoustic wave (BAW) resonator, a film bulk acoustic resonator (FBAR), and a microelectromechanical system (MEMS) resonator. Another optional method further comprises mapping the frequency response requirements to a normalized design space, in which case, the circuit element values are normalized values that are determined based on the mapped frequency response requirements, and unmapping the normalized circuit element values of the acoustic filter circuit design to a real design space.

The method further comprises selecting lossless circuit response variables based on the frequency response requirements (e.g., in the form of a ratio between numerator polynomials defining transmission zeroes and denominator polynomials defining reflection zeroes multiplied by a scale factor), and selecting a value for each of the circuit elements based on the selected circuit response variables to create an initial filter circuit design.

The method further comprises transforming the resonant element(s) and the other reactive circuit element(s) of the initial filter circuit design into at least one acoustic resonator model to create an acoustic filter circuit design. In one embodiment, the acoustic resonator model is a Butterworth-Van Dyke (BVD) model. In this case, the other reactive circuit element(s) may comprise an in-shunt admittance inverter in series with the in-shunt parallel L-C-resonator combination, and an in-shunt non-resonant susceptance in parallel with the in-shunt parallel L-C resonator combination, and the in-shunt parallel L-C resonator combination, in-shunt admittance inverter, and in-shunt non-resonant susceptance may be transformed into one of the BVD model(s). For example, the in-shunt parallel L-C resonator combination and the in-shunt admittance inverter may be transformed into an in-shunt series L-C resonator combination, and the in-shunt series L-C resonator combination and in-shunt non-resonant susceptance may be transformed into the one BVD model. In this case, the one BVD model may be an in-shunt BVD model. In this embodiment, the reactive circuit element may further comprise two in-line admittance inverters coupled to a node between the in-shunt parallel L-C resonator combination and the in-shunt non-resonant susceptance, and the in-shunt BVD model and the two in-line admittance inverters may be transformed into an in-line BVD model and a reactance in series with the in-line BVD model.

In one embodiment, a plurality of resonant elements, a plurality of reactive circuit elements, and a plurality of resonator models are provided. In this case, the method may further comprise dividing the initial filter circuit design into a plurality of sub-set circuit designs, each of which includes one of the resonant elements and one or more of the plurality of reactive circuit elements, wherein, for each sub-set circuit design, the resonant element and the reactive circuit element(s) are transformed into a respective one of the acoustic resonator models.

The method further comprises adding parasitic effects to the acoustic filter circuit design to create a pre-optimized filter circuit design, optimizing the pre-optimized filter circuit design to create a final filter circuit design (e.g., by inputting the pre-optimized filter circuit design into a filter optimizer to create the final filter circuit design), and constructing the acoustic microwave filter based on the final filter circuit design. An optional method further comprises performing an element removal optimization of the pre-optimized filter circuit design to create the final filter circuit design.

If a plurality of resonant elements are provided, the method may optionally comprise changing the order in which the plurality of resonant elements in the pre-optimized filter circuit design are disposed along a signal transmission path to create a plurality of filter solutions, computing a performance parameter for each of the filter solutions, comparing the performance parameters to each other, and selecting one of the filter solutions as the pre-optimized circuit design based on the comparison of the computed performance parameters. In one method, the final circuit design comprises a plurality of acoustic resonators, and the difference between the lowest resonant frequency and the highest resonant frequency of the plurality of acoustic resonators in the final filter circuit design is at least one time, preferably at least two times, and more preferably at least three times, the maximum frequency separation of a single resonator in the plurality of acoustic resonators.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 16 is a table illustrating the element values of the pre-optimized filter circuit design of FIG. 15;

FIG. 19 is a table illustrating the element values of the optimized filter circuit design of FIG. 18;

FIG. 27 is a table illustrating the element values of the pre-optimized filter circuit design of FIG. 26;

DETAILED DESCRIPTION OF THE EMBODIMENTS

The present disclosure describes a network synthesis technique for designing acoustic wave (AW) microwave filters (such as surface acoustic wave (SAW), bulk acoustic wave (BAW), film bulk acoustic resonator (FBAR), microelectromechanical system (MEMS) filters)). This network synthesis technique yields better performing and/or lower cost AW microwave filters (i.e., at frequencies greater than 500 MHz) over previous AW microwave filter design methods. Such AW microwave filters may be either fixed frequency and/or tunable filters (tunable in frequency and/or bandwidth and/or input impedance and/or output impedance), and may be used for single band or multiple band bandpass filtering and/or bandstop. Such AW microwave filters are advantageous in applications that have demanding electrical and/or environmental performance requirements and/or severe cost/size constraints, such as those found in the radio frequency (RF) frontends of mobile communications devices, including cellphones, smartphones, laptop computers, tablet computers, etc. or the RF frontends of fixed communications devices, including M2M devices, wireless base stations, satellite communications systems, etc.

Figure 28:
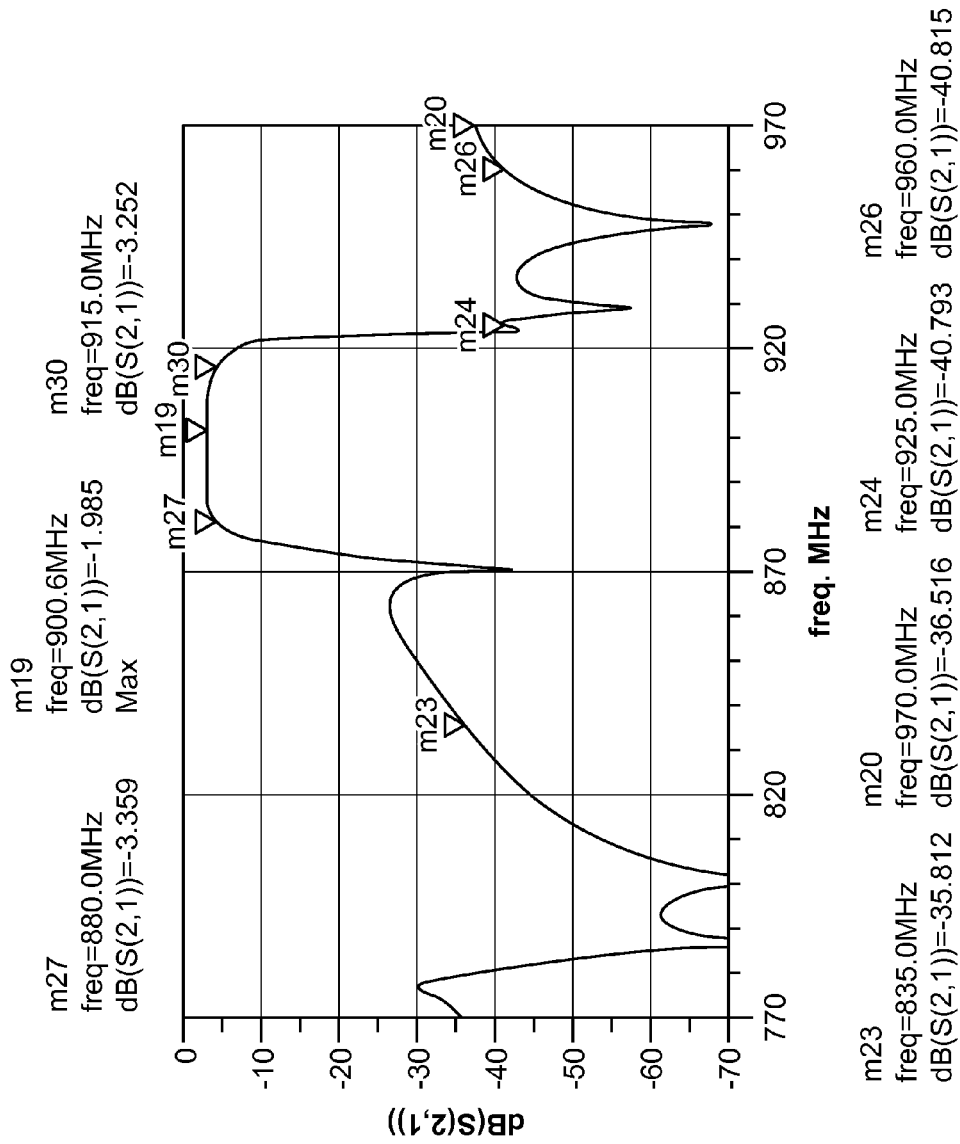
FIG. 28 is a S21 Band 5 frequency response plot of the filter circuit design of FIG. 25 after optimization.
Figure 29:
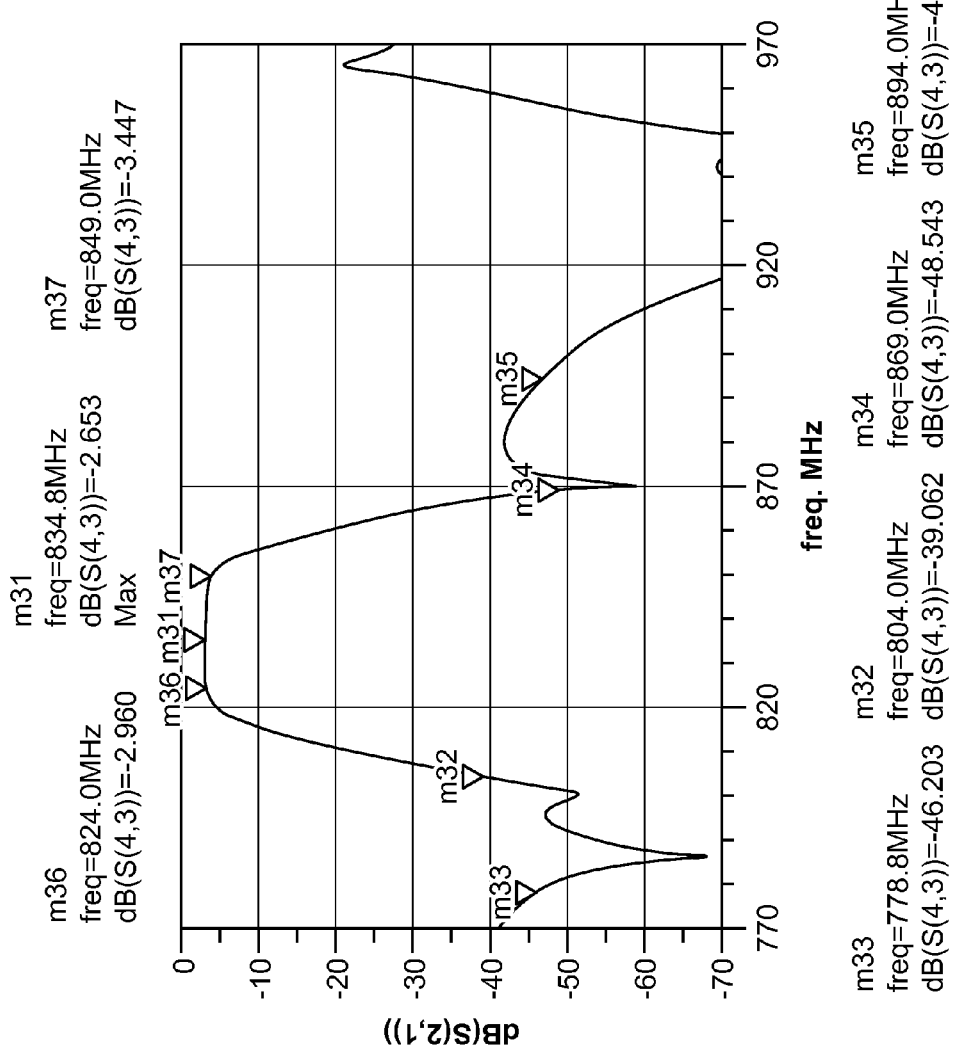
FIG. 29 is a S21 Band 8 frequency response plot of the filter circuit design of FIG. 25 after optimization.

Example AW microwave filters described herein (e.g. FIGS. 28-29) exhibit a frequency response with a single passband and a single stopband, which is particularly useful in telecommunication system duplexers where a passband with a closely spaced stopband is required. For example, with reference to FIG. 1, a telecommunications system 10 for use in a mobile communications device may include a transceiver 12 capable of transmitting and receiving wireless signals, and a controller/processor 14 capable of controlling the functions of the transceiver 12. The transceiver 12 generally comprises a broadband antenna 16, a duplexer 18 having a transmit filter 24 and a receive filter 26, a transmitter 20 coupled to the antenna 16 via the transmit filter 24 of the duplexer 18, and a receiver 22 coupled to the antenna 16 via the receive filter 26 of the duplexer 18.

The transmitter 20 includes an upconverter 28 configured for converting a baseband signal provided by the controller/processor 14 to a radio frequency (RF) signal, a variable gain amplifier (VGA) 30 configured for amplifying the RF signal, a bandpass filter 32 configured for outputting the RF signal at an operating frequency selected by the controller/processor 14, and a power amplifier 34 configured for amplifying the filtered RF signal, which is then provided to the antenna 16 via the transmit filter 24 of the duplexer 18.

The receiver 22 includes a notch or stopband filter 36 configured for rejecting transmit signal interference from the RF signal input from the antenna 16 via the receiver filter 26, a low noise amplifier (LNA) 38 configured for amplifying the RF signal from the stop band filter 36 with a relatively low noise, a bandpass filter 40 configured for outputting the amplified RF signal at a frequency selected by the controller/processor 14, and a downconverter 42 configured for downconverting the RF signal to a baseband signal that is provided to the controller/processor 14. Alternatively, the function of rejecting transmit signal interference performed by the stopband filter 36 can instead be performed by the duplexer 18. Or, the power amplifier 34 of the transmitter 20 can be designed to reduce the transmit signal interference.

Figure 1:
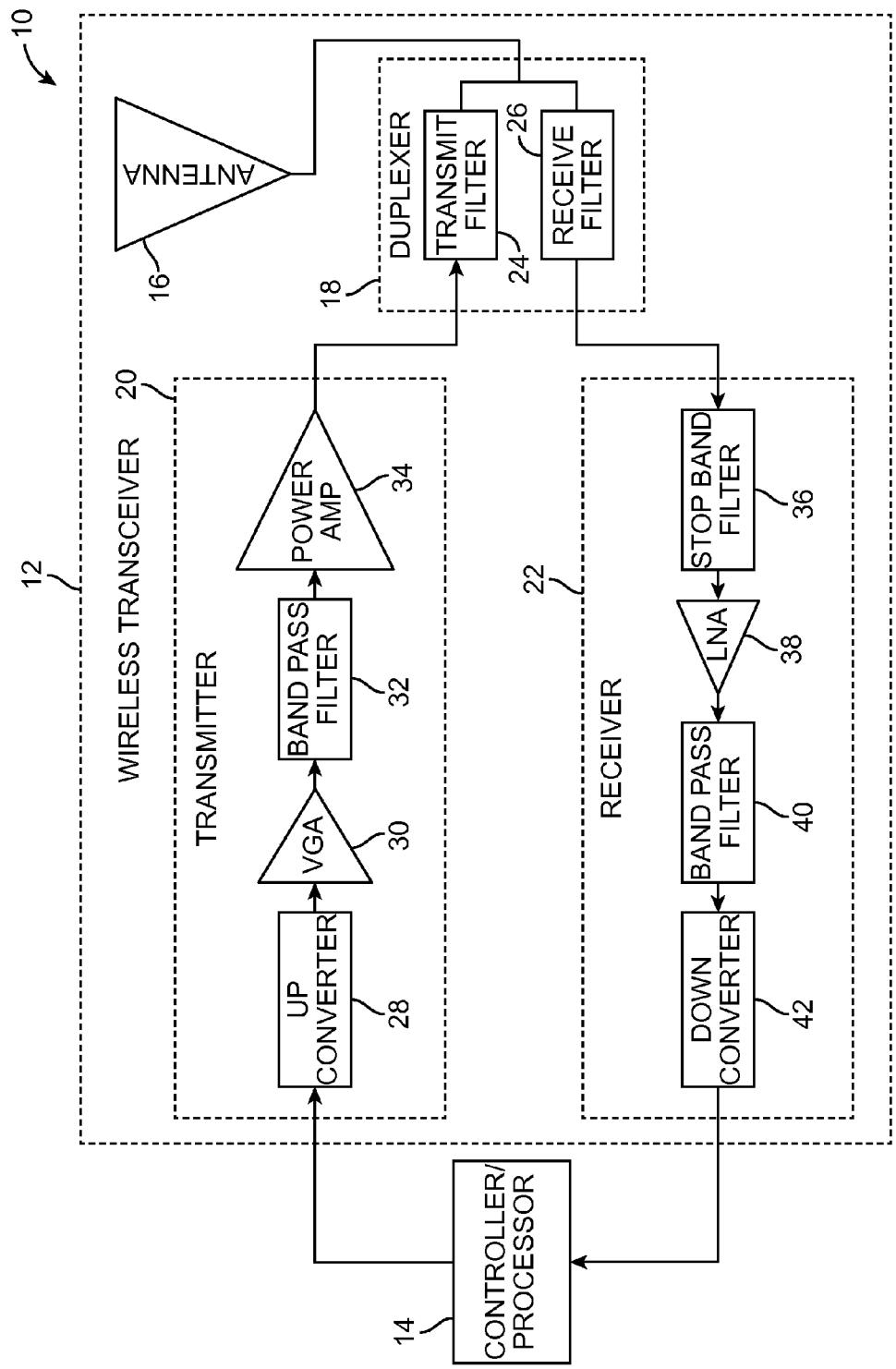
FIG. 1 is a block diagram of a wireless telecommunications system.

It should be appreciated that the block diagram illustrated in FIG. 1 is functional in nature, and that several functions can be performed by one electronic component or one function can be performed by several electronic components. For example, the functions performed by the up converter 28, VGA 30, bandpass filter 40, downconverter 42, and controller/processor 14 are oftentimes performed by a single transceiver chip. The function of the bandpass filter 32 can be performed by the power amplifier 34 and the transmit filter 24 of the duplexer 18.

The exemplary network synthesis technique described herein is used to design acoustic microwave filters for the front-end of the telecommunications system 10, and in particular the transmit filter 24 of the duplexer 18, although the same technique can be used to design acoustic microwave filters for the receive filter 26 of the duplexer 18 and for other RF filters.

Figure 2:
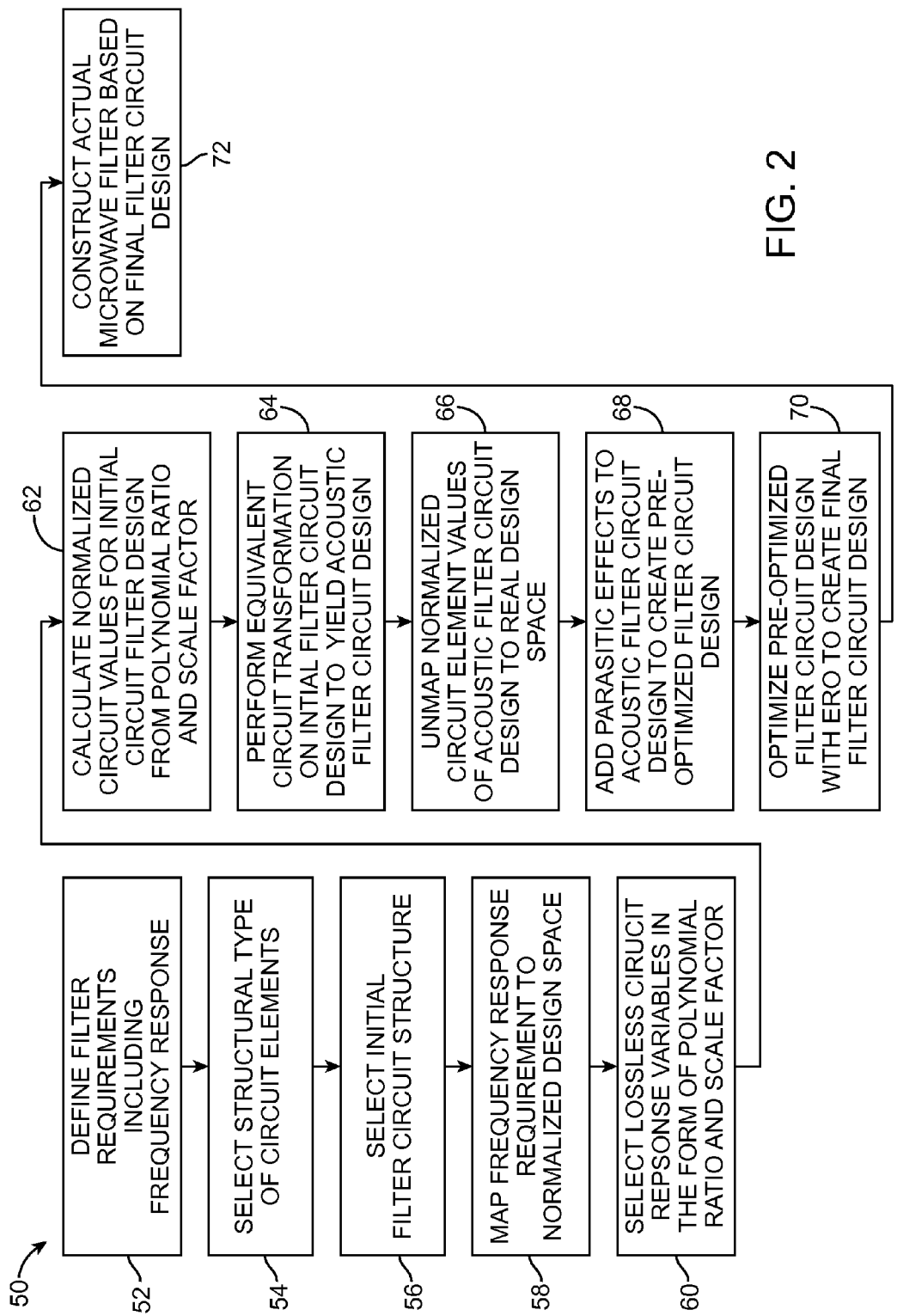
FIG. 2 is a flow diagram illustrating a network synthesis technique used to design an acoustic filter in accordance with one method of the present inventions.

Referring now to FIG. 2, one exemplary network synthesis technique 50 for designing an AW microwave filter will be described. First, the filter requirements, which comprise the frequency response requirements (including passband, return loss, insertion loss, rejection, linearity, noise figure, input and output impedances, etc.), as well as size and cost requirements, and environmental requirements, such as operating temperature range, vibration, failure rate, etc., are established by the application of the filter (step 52). In the illustrated embodiment, the design targets the following requirements: one passband from 1850 MHz to 1910 MHz with a maximum insertion loss requirement of 2 dB, and three stopbands, a first one from 1930 MHz to 1990 MHz with a minimum rejection of 44 dB, a second one from 2010 MHz to 2025 MHz and a minimum rejection of 20 dB, and a third one from 2110 MHz to 2155 MHz with a minimum rejection of 45 dB.

Next, the structural types of circuit elements to be used in the AW filter are selected; for example, the structural type of resonator (SAW, BAW, FBAR, MEMS, etc.) and the types of inductor, capacitor, and switch, along with the materials to be used to fabricate these circuit elements, including the packaging and assembly techniques for fabricating the filter, are selected (step 54). In the particular example described herein, the selection of circuit element types are SAW resonators and capacitors constructed on a substrate composed of 42-degree XY-cut LiTaO3.

Then, an initial circuit structure, such as an in-line non-resonant-node, or in-line, or in-line with cross couplings, or in-line non-resonant node with cross couplings, etc., is selected based on the passband(s) and/or stopband(s) obtained from the frequency response requirements (step 56). In the illustrated embodiment, the initial circuit structure selected is the in-line non-resonant-node structure, such as those described in U.S. Pat. Nos. 7,719,382, 7,639,101, 7,863,999, 7,924,114, 8,063,714, and U.S. Provisional Patent Application Ser. No. 61/802,114, entitled "Element Removal Design in Microwave Filters," which are all expressly incorporated herein by reference. For the purposes of this specification, the term "structure" shall refer to the element types and their interconnections without consideration the values of the elements.

Figure 3:
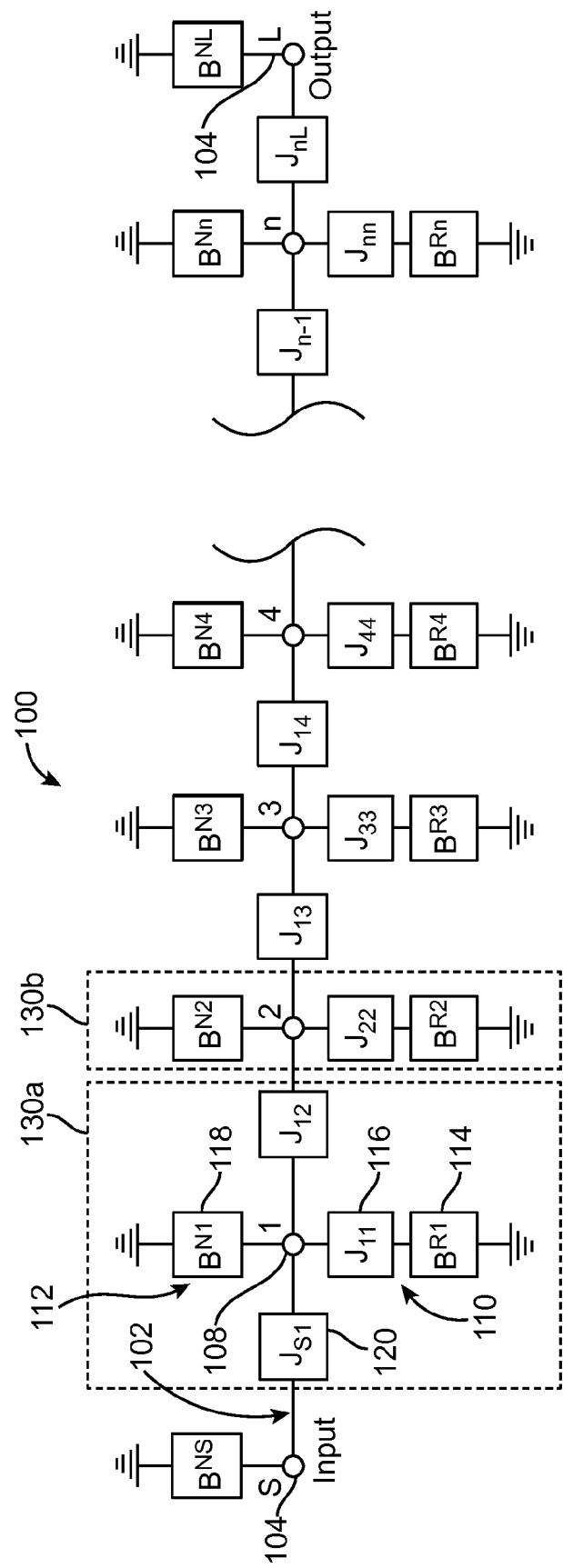
FIG. 3 is a schematic diagram of an in-line non-resonant node filter used as the initial filter circuit structure for the network synthesis technique of FIG. 2.

Referring to FIG. 3, one such embodiment of an in-line non-resonant-node initial filter circuit structure 100 generally comprises a signal transmission path 102 having an input 104 (represented by node S) and an output 106 (represented by node L), a plurality of nodes 108 (represented by nodes S, 1, 2 . . . n) disposed along the signal transmission path 102, a plurality of resonant branches 110 respectively coupling the nodes 108 to ground, and a plurality of non-resonant branches 112 respectively coupling the nodes 108 to ground in respective parallel to the resonant branches 110.

The initial filter circuit structure 100 further comprises a plurality of in-shunt resonant elements 114 (represented by susceptances $B^{R1}, B^{R2} \ldots B^{Rn}$) respectively located in the resonant branches 110 and a plurality of in-shunt non-resonant elements 116 (represented by admittance inverters $J_{11}, J_{22} \ldots J_{nn}$) in series with the resonant elements 114. The initial filter circuit structure 100 further comprises a plurality of in-shunt non-resonant elements 118, two of which couple the node S and node L to ground (represented by susceptances $B^{NS}$ and $B^{NL}$ respectively) and four of which are respectively located in the non-resonant branches 110 (represented by $B^{N1}, B^{N2} \ldots B^{Nn}$). The initial filter circuit structure 100 further comprises a plurality of in-line non-resonant elements 120 (represented by admittance inverters $J_{S1}, J_{12}, J_{23} \ldots J_{n-1, n}, J_{nL}$) respectively coupling the nodes S, 1, 2 . . . n, L together.

Figure 4:
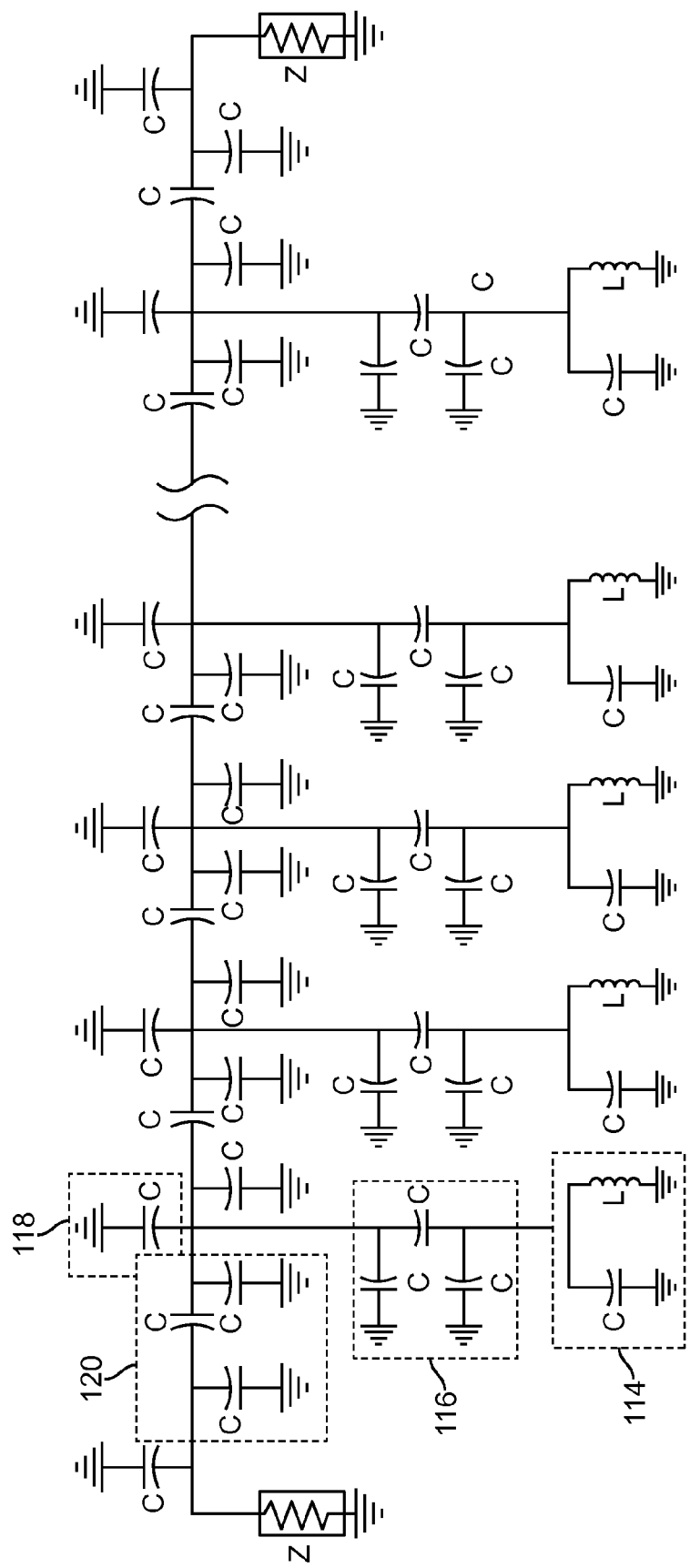
FIG. 4 is a schematic diagram of a parallel L-C resonator combination of the initial filter circuit structure of FIG. 3.

The initial filter circuit structure 100 may further comprise a plurality of tuning elements (not shown) for adjusting the frequencies of the resonant elements 114 and/or values of the non-resonant elements 120, and an electrical controller (not shown) configured for tuning the initial filter circuit structure 100 to a selected narrow-band within a desired frequency range by varying selected ones of the non-resonant elements 116-120. Thus, the initial filter circuit structure 100 is useful for network synthesis of reconfigurable bandpass filters, provided that the high Q-factor resonant elements 114 used to realize the susceptance $B^R$ values are well-described by a parallel L-C resonator combination, i.e. tank circuit, as shown in FIG. 4.

Figure 5:
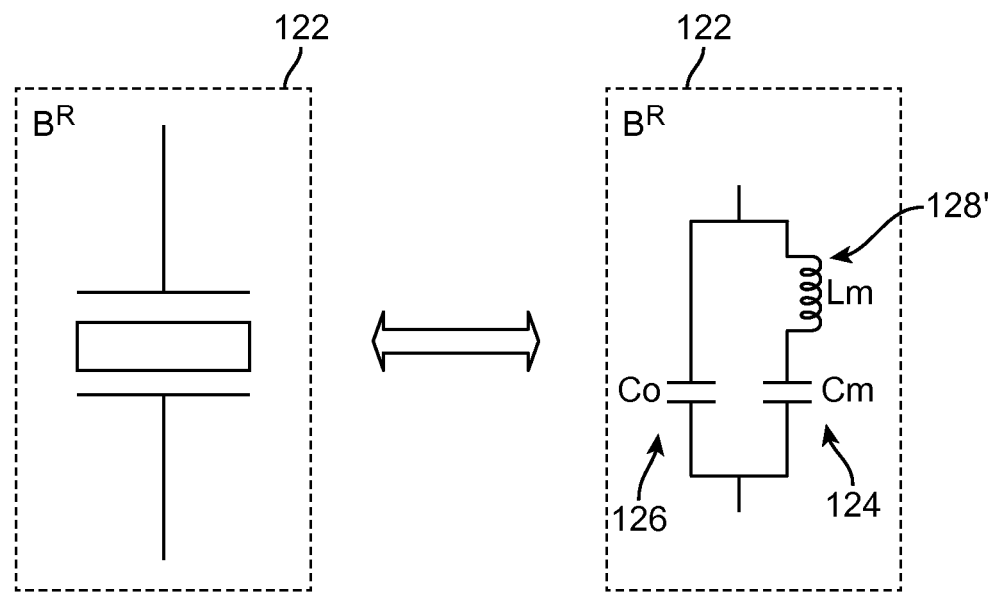
FIG. 5 is an equivalent circuit schematic diagram for a Butterworth-Van Dyke (BVD) acoustic wave resonator model.

The high Q-factor resonant elements 114 are better described using a Butterworth-Van Dyke (BVD) model 122 illustrated in FIG. 5. BVD models 122 may also describe SAW resonators, which may be fabricated by disposing interdigital transducers (IDTs) on a piezoelectric substrate, such as crystalline Quartz, Lithium Niobate (LiNbO$_3$), Lithium Tantalate (LiTaO$_3$) crystals or BAW (including FBAR) resonators fabricated in materials such as quartz or Aluminum Nitride, or MEMS resonators. The BVD model 122 includes a motional capacitance $C_m$ 124, a static capacitance $C_0$ 126, and a motional inductance $L_m$ 128. The motional capacitance $C_m$ 124 and motional inductance $L_m$ 128 may result from the interactions of electrical and acoustical behavior, and thus, may be referred to as the motional arm of the BVD model 122. The static capacitance $C_0$ 126 may result from electrical behavior of the structure alone (conductors, dielectrics and gaps), and thus, may be referred to as the static (non-motional) capacitance of the BVD model 122. The parameters are related by the following equations:

$$\omega_R = \frac{1}{\sqrt{L_m C_m}}; \quad [2]$$

$$\frac{\omega_A}{\omega_R} = \sqrt{1 + \frac{1}{\gamma}}, \quad [3]$$

where $\omega_R$ and $\omega_A$ may be the respective resonance and anti-resonance frequencies for any given acoustic resonator, and gamma $\gamma$ may depend on a material's property, which may be further defined by:

$$\frac{C_0}{C_m} = \gamma. \quad [4]$$

Typical $\gamma$ values may range from about 12 to about 18 for 42-degree X Y cut LiTaO$_3$. The frequency separation of an acoustic resonator means the difference between its resonant frequency and its anti-resonant frequency. The percentage separation of an acoustic wave resonator is the percentage frequency separation between its resonant frequency and anti-resonant frequency, and can be computed, as follows:

$$\text{percentage seperation} = \sqrt{1 + (1/\gamma)} - 1 \quad [8]$$

where $\gamma$ is the ratio of the static to the motional capacitance of the resonator (equation [4]), as determined by the material properties of the piezoelectric material and modified by the geometry of the device.

The resonant frequency $\omega_R$ of an acoustic resonator means the frequency where the magnitude of the impedance reaches a local minimum and the phase of the impedance crosses zero. The anti-resonant frequency $\omega_A$ of an acoustic resonator means the frequency where the magnitude of the impedance reaches a local maximum and the phase of the impedance crosses zero.

It can be appreciated from equation [1] that the resonant frequency of each of the acoustic resonators will depend on the motional arm of the BVD model 122, whereas the filter characteristics (e.g., bandwidth) will be strongly influenced by $\gamma$ in equation [2]. The Quality factor (Q) for an acoustic resonator 122 may be an important figure of merit in acoustic filter design, relating to the loss of the element within the filter. Q of a circuit element represents the ratio of the energy stored per cycle to the energy dissipated per cycle. The Q factor models the real loss in each acoustic resonator, and generally more than one Q factor may be required to describe the loss in an acoustic resonator. Q factors may be defined as follows for the filter examples. The motional capacitance $C_m$ 124 may have an associated Q defined as $Q_{cm}=10^8$; the static capacitance $C_0$ 126 may have an associated Q defined as $Q_{c0}=200$; and motional inductance $L_m$ 128 may have an associated Q defined as $Q_{Lm}=1000$. (Here for simplicity the loss in the motional resonance is lumped into the motional inductance and the motional capacitance is considered to be essentially loss-less.) Circuit designers may typically characterize SAW resonators by resonant frequency $\omega_R$, static capacitance $C_0$, gamma $\gamma$, and Quality factor $QL_m$. For commercial applications, $QL_m$ may be about 1000 for SAW resonators, and about 3000 for BAW resonators.

Referring back to the FIG. 2, the frequency response requirements are then mapped to a normalized design space (step 58). The mapping may be performed using a suitable algorithm, such as a square-root/quadratic mapping technique (see George L. Matthaei, Microwave Filters, Impedance-Matching Networks, and Coupling Structures, McGraw-Hill Book Company, pp. 95-97, 438-440 (1964), or a logarithmic/exponential mapping technique more suitable to acoustic wave resonators.

One attractive logarithmic mapping technique uses the following equations:

$$\Omega = \ln\left(\frac{\omega^2}{\omega_P^2}\right) / \ln\left(1 + \frac{1}{\gamma}\right), \quad [5]$$

$$|\Omega_R - \Omega_A| = 1 \quad [6]$$

where $\omega_p/2\pi$ is the geometric center frequency of the passband or stopband, $\omega/2\pi$ is the real frequency, $\Omega$ is the mapped frequency, $\gamma$ is the ratio of the static to the motional capacitance of the resonator, and $\Omega_R$ is the mapped resonant frequency of the resonator, and $\Omega_A$ is the mapped anti-resonant frequency of the resonator.

Next, lossless circuit response variables are provided in the form of a ratio between numerator polynomials defining transmission zeroes and denominator polynomials defining reflection zeroes multiplied by a scale factor, as provided in equation [1] (step 60). In general, the total number of transmission zeroes may be greater equal to or greater than the total number of reflection zeroes, and often one or more reflection zeroes will lie outside any passband of the filter.

Next, the mapped and normalized circuit element values for the initial filter circuit structure 100 are then calculated from these polynomials using a coupling matrix or parameter extraction methods or equivalent circuit synthesis techniques (step 62) to create an initial lossless circuit design. For the purposes of this specification, a "circuit design" shall refer to the circuit structure with consideration to the values of the elements making up the circuit structure.

Next, equivalent circuit transformations may then be performed to reduce the number of circuit elements, or change the type of circuit elements, the size of the circuit, or the realizability of the individual circuit elements to create an acoustic filter circuit design (step 64). These transformations do not substantially change the response of the initial lossless circuit design, and may utilize equivalent circuit transformations, such as equating a J-inverter to an equivalent capacitive or inductive PI- or T-network. For example, a shunt-resonator/two J-inverter combination may be transformed into a single series resonator; a series-resonator/two J-inverter combination may be transformed into a single shunt resonator, multiple parallel capacitances may be combined into a single capacitor, or to otherwise eliminate capacitors negative capacitors may be removed by combining with positive parallel capacitors to yield a single positive capacitor, multiple series inductors may be combined into a single inductor, or to otherwise eliminate inductors negative inductors may be removed by combining with positive series inductors to yield a single positive inductor, or other equivalent circuit transformations may be performed to obtain a lossless circuit that may have the target circuit response, but be smaller, less costly, and/or more realizable than the initial lossless circuit design.

Significantly, although the acoustic resonant elements $B^R$ are best described by the BVD model 122 illustrated in FIG. 5, a challenge arises because the BVD model 122, due to its additional static capacitance $C_0$, cannot be directly incorporated into the L-C equivalent initial filter circuit design 100 illustrated in FIG. 4. Thus, one particular type of circuit transformation involves transforming the initial filter circuit design 100 into a suitable structure in which an acoustic resonator model, and in this case a BVD model 122, can be incorporated. This circuit transformation can best be performed by dividing the initial filter circuit design 100 into multiple sub-sets equal to the number of resonating elements 114. Each sub-set includes the circuit elements that are coupled to each node to which a resonant branch 110 and a non-resonant branch 112 are coupled. The nature of each sub-set will depend on whether a shunt acoustic resonator or an in-line acoustic resonator is desired.

Figure 6:
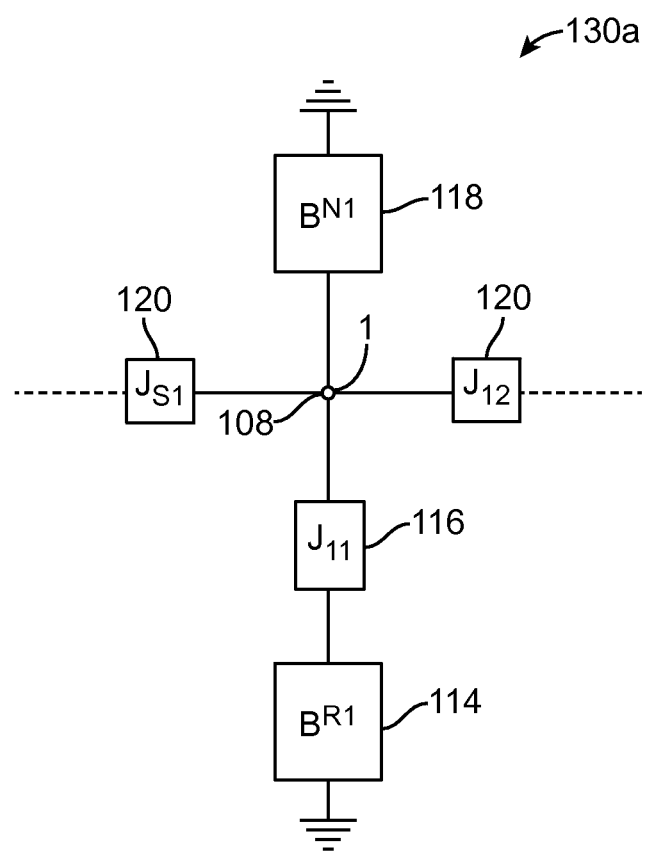
FIG. 6 is a sub-set circuit design taken from the initial filter circuit structure (design) of FIG. 3 in accordance with the network synthesis technique of FIG. 2, whereby an in-line acoustic resonator is incorporated into the initial filter circuit design of FIG. 3

For example, in one transformation technique that incorporates an in-line acoustic resonator into the initial filter circuit design 100, a particular subset circuit design includes a resonant element 114 (susceptance $B^R$) coupled from the respective node 108 to ground, a non-resonant element 116 (admittance inverter J) coupled in series with the resonant element 114, a non-resonant element 118 (susceptance $B^N$) coupled from the respective node 108 to ground in parallel to the resonant element 114 (susceptance $B^R$), and two non-resonant elements 120 (admittance inverters J) coupled in-line to the respective node 108. For example, as illustrated in FIG. 6, the sub-set 130a includes node 1, and thus, resonant element $B^{R1}$ is coupled from the respective node 108 to ground, admittance inverter element $J_{11}$ is coupled in series with the resonant element $B^{R1}$, non-resonant element $B^{N1}$ is coupled from the respective node 108 to ground in parallel with the resonant element $B^{R1}$, and two admittance inverters $J_{S1}$ and $J_{12}$ coupled in-line with the respective node 108.

Figure 7:
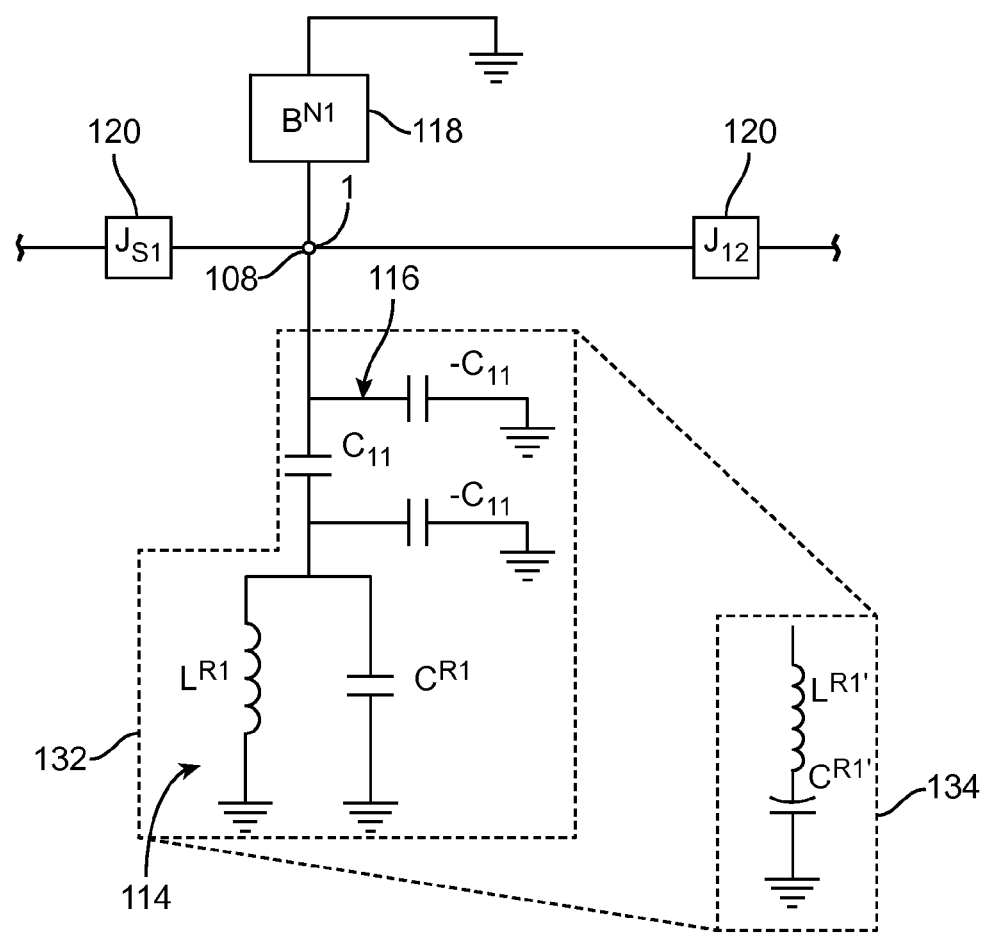
FIGS. 7-9 are circuit transformations sequentially made to the sub-set circuit design of FIG. 6 in accordance with the network synthesis technique of FIG. 2.

As shown in FIG. 7, the admittance inverter $J_{11}$ is replaced with a capacitive PI-network (capacitors $-C_{11}$, $C_{11}$, and $-C_{11}$), and the resonating element $B_1^R$ is replaced with a parallel L-C resonator combination of an inductance (inductor $L^{R1}$) and a capacitance (capacitor $C^{R1}$). The circuit sub-structure 132 represented by the PI-network consisting of capacitors $-C_{11}$, $C_{11}$, and $-C_{11}$ and the parallel L-C resonator combination of the inductor $L^{R1}$ and the capacitor $C^{R1}$ can be transformed into a series L-C resonator combination 134 of an inductance (inductor $L^{R1'}$) and capacitance (capacitor $C^{R1'}$). Significantly, this series L-C combination 134 can be realized by the series resonance leg of a BVD model 122, so that it can be better incorporated into the circuit sub-structure 132.

Figure 8:
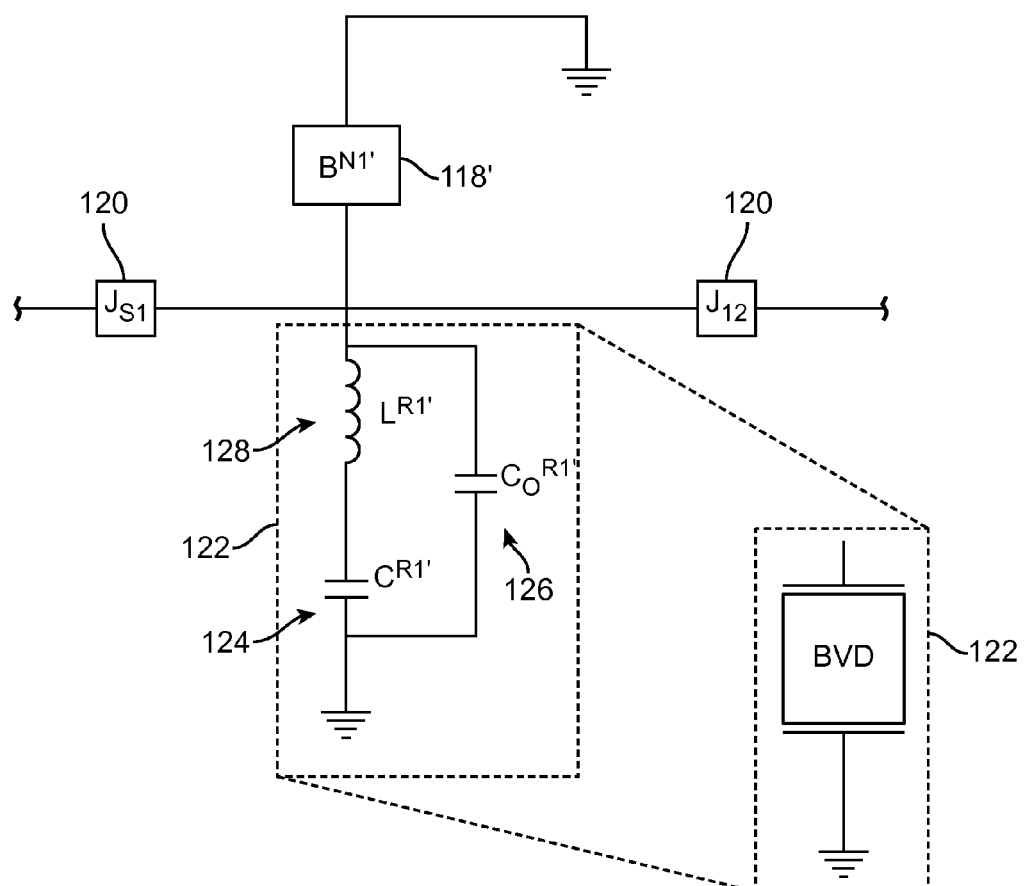
Figure 9:
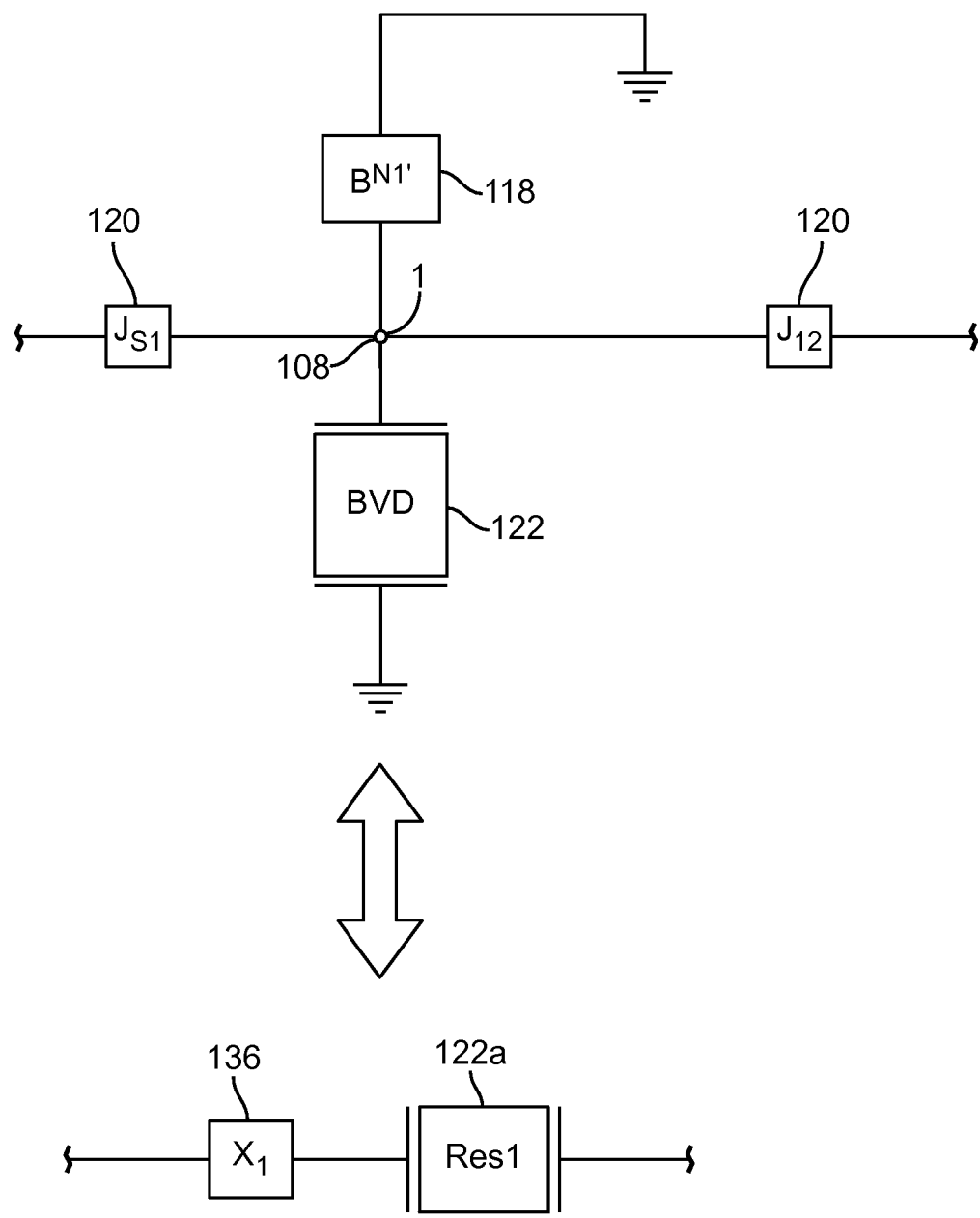

In order to incorporate the BVD model 122 into the circuit sub-structure 132, the static capacitance $C_0$ of the BVD model 122 must be accommodated. This can be accomplished by replacing the parallel susceptance $B_1^N$ with a capacitance ($C_0^{R1'}$ and susceptance $B^{N1'}$), as shown in FIG. 8. $C_0^{R1'}$ represents the static capacitance of the BVD model 122 and $B^{N1'}$ is given by the relationship $B^{N1} - \omega(C_0^{R1})$. The susceptance $B^{N1'}$, two in-line admittance inverters $J_{S1}$ and $J_{12}$, and shunt acoustic resonator 122 can then be transformed into an in-line acoustic resonator 122a and a series reactance 136 (designated $X_1$), as illustrated in FIG. 9.

Figure 10:
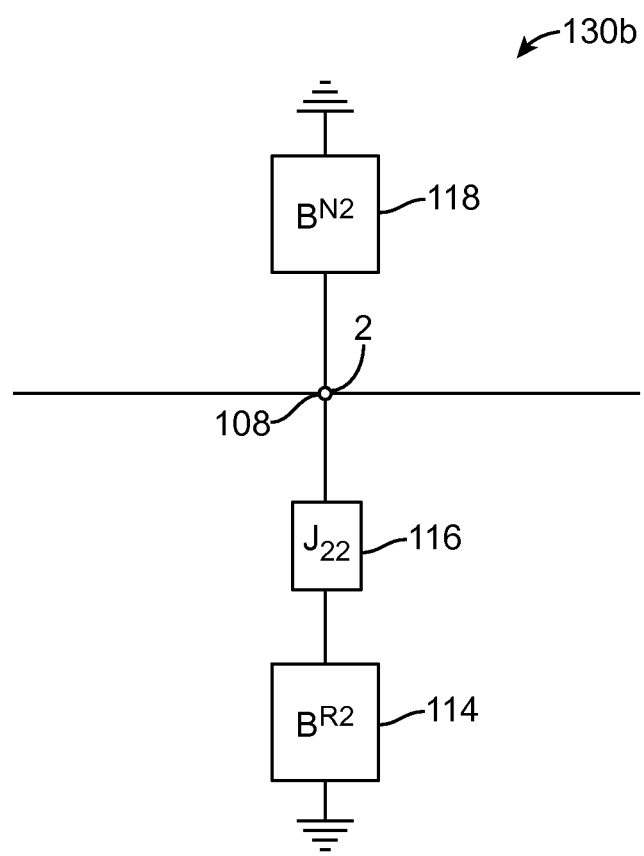
FIG. 10 is another sub-set circuit design taken from the initial filter circuit structure of FIG. 3 in accordance with the network synthesis technique of FIG. 2.

In a transformation technique that incorporates an in-shunt acoustic resonator into the initial filter circuit design 100, a particular sub-set includes a resonant element 114 (susceptance $B^R$) coupled from the respective node 108 to ground, a non-resonant element 116 (admittance inverter J) coupled in series with the resonant element 114, and a non-resonant element 118 (susceptance $B^N$) coupled from the respective node 108 to ground in parallel to the resonant element 114 (susceptance $B^R$). For example, as illustrated in FIG. 10, the sub-set 130b includes node 2, and thus, resonant element $B^{R2}$ is coupled from the respective node 108 to ground, admittance inverter element $J_2$ is coupled in series with the resonant element $B^{R2}$, and non-resonant element $B^{N2}$ is coupled from the respective node 108 to ground in parallel with the resonant element $B^{R2}$.

Figure 11:
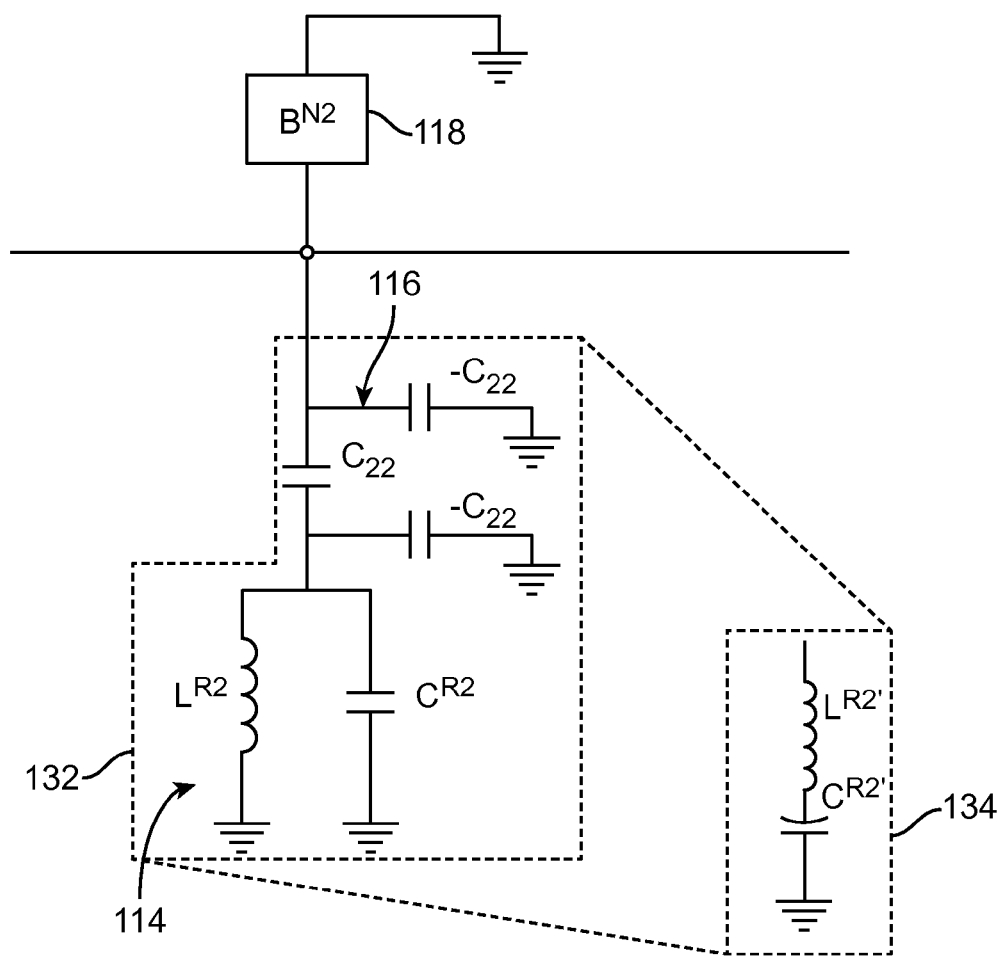
FIGS. 11-13 are circuit transformations sequentially made to the sub-set circuit design of FIG. 10 in accordance with the network synthesis technique of FIG. 2, whereby an in-shunt acoustic resonator is incorporated into the initial filter circuit structure of FIG. 3.

As shown in FIG. 11, the admittance inverter $J_{22}$ is replaced with a capacitive PI-network (capacitors $-C_{22}$, $C_{22}$, and $-C_{22}$), and the resonating element $B^{R2}$ is replaced with a parallel L-C resonator combination of an inductance (inductor $L^{R2}$) and a capacitance (capacitor $C^{R2}$). The circuit sub-structure 132 represented by the PI-network consisting of capacitors $-C_{22}$, $C_{22}$, and $-C_{22}$ and the parallel L-C resonator combination of the inductor $L^{R2}$ and the capacitor $C^{R2}$ can be transformed into a series L-C combination 134 of an inductance (inductor $L^{R2'}$) and capacitance (capacitor $C^{R2'}$). Significantly, this series L-C combination 134 can be realized by the series resonance leg of a BVD model 122, so that it can be better incorporated into the circuit sub-structure 132.

Figure 12:
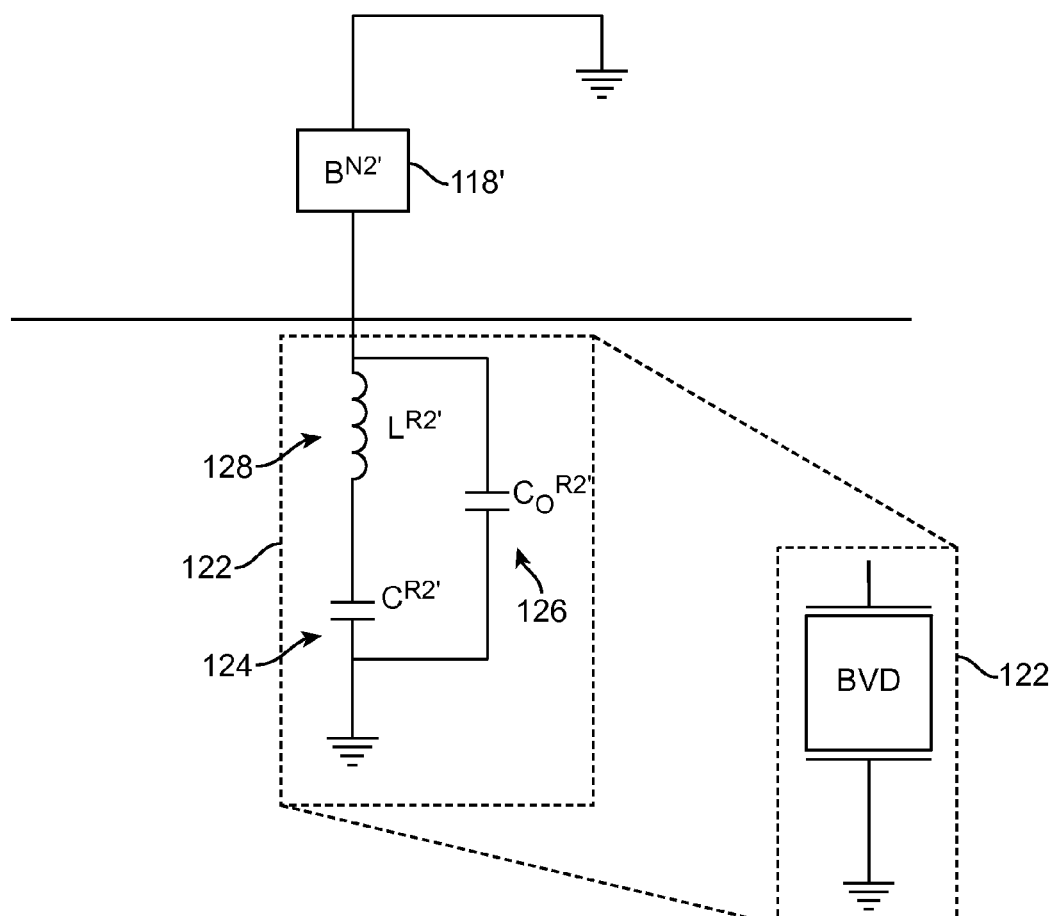
Figure 13:
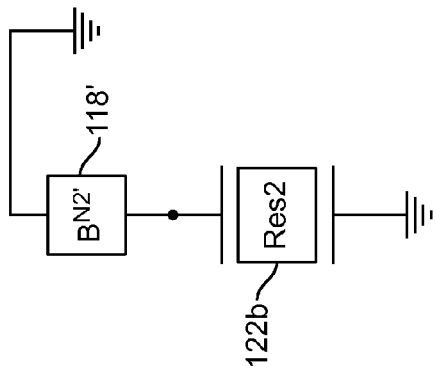

In order to incorporate the BVD model 122 into the circuit sub-structure 132, the static capacitance $C_0$ of the BVD model 122 must be accommodated. This can be accomplished by replacing the parallel susceptance $B^{2N}$ with a capacitance ($C_0^{R1'}$ and susceptance $B^{N1'}$), as shown in FIG. 12. $C_0^{R2'}$ represents the static capacitance of the BVD model 122 and $B^{N2'}$ is given by the relationship $B^{N2} - \omega(C_0^{R2})$. Thus, an in-shunt acoustic resonator 122b can be realized, as illustrated in FIG. 13.

Figure 14:
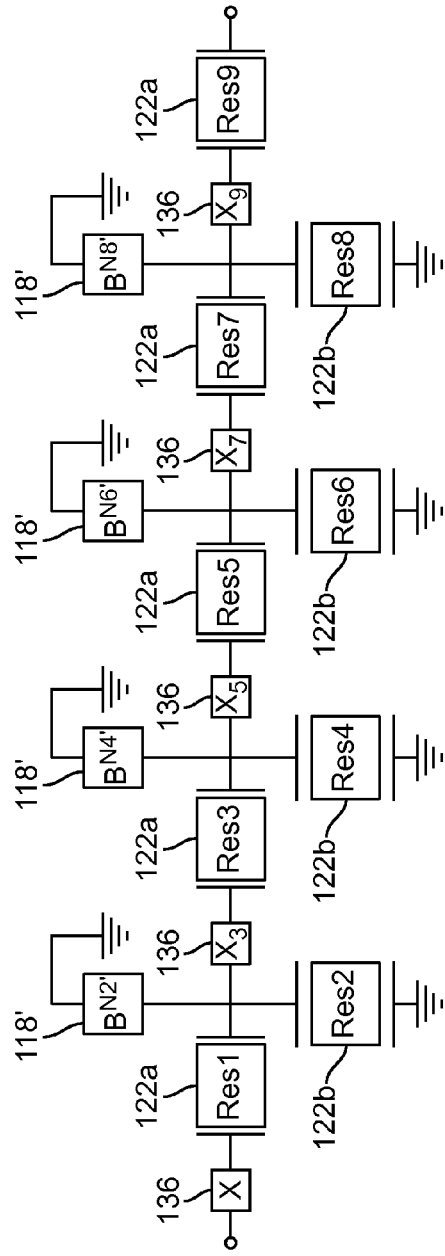
FIG. 14 is a schematic diagram of an acoustic filter circuit design generated from the sub-set acoustic circuit designs of FIGS. 9 and 13 in accordance with the network synthesis technique of FIG. 2.

It can be appreciated that the initial filter circuit design 100 can be divided into alternating sub-sets 130a and 130b, such that a filter circuit design having alternating in-line acoustic resonators 122a and in-shunt resonators 122b can be generated. For example, an initial filter circuit design 100 with nine resonators $B^R$ can be transformed into an acoustic filter circuit structure 150a having five in-line acoustic resonators 122a and four in-shunt acoustic resonators 122b arranged in an alternating fashion, as illustrated in FIG. 14.

Although the circuit transformation step is described as being performed on the initial filter circuit design (i.e., after calculating the mapped and normalized circuit elements values), it should be appreciated that the circuit transformations step can be performed on the initial filter circuit structure (i.e., prior to calculating the mapping and normalized circuit element values) to create an acoustic filter circuit structure, in which case, the mapped and normalized circuit element values for the acoustic filter circuit structure can be computed to create an acoustic filter circuit design.

Referring back to FIG. 2, the circuit elements of the acoustic filter circuit design 150a are unmapped to a real design space (i.e., lossless circuit elements (L's and C's) with real frequencies) in accordance with the inverse of the mapping technique initially used to map the frequency response requirements to the normalized design space (step 66). For example, if the logarithmic mapping technique of equation [5] was used to map the frequency response requirements to the normalized space, then the following logarithmic unmapping equation can be used to unmap the normalized circuit element values to the real design space:

$$\omega = \omega_P \left(1 + \frac{1}{\gamma}\right)^{\Omega/2} \quad [7]$$

Figure 15:
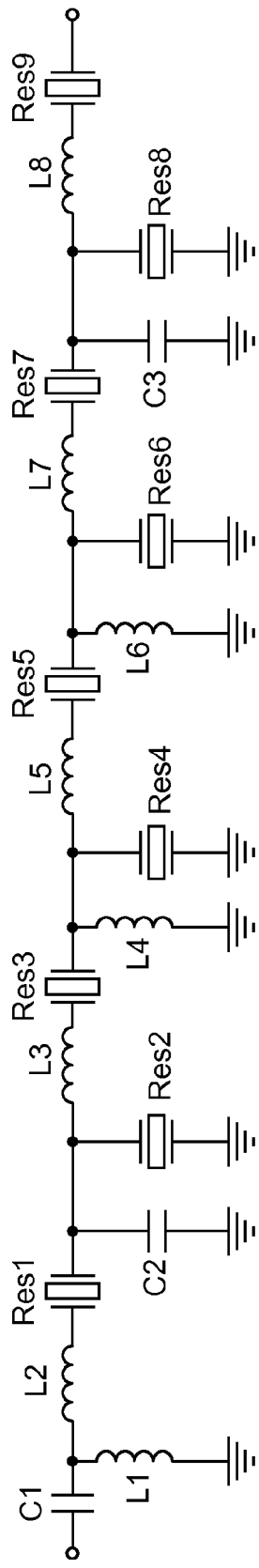
FIG. 15 is a schematic diagram of a pre-optimized filter circuit design realized from the acoustic filter circuit design of FIG. 14 in accordance with the network synthesis technique of FIG. 2.
Figure 17:
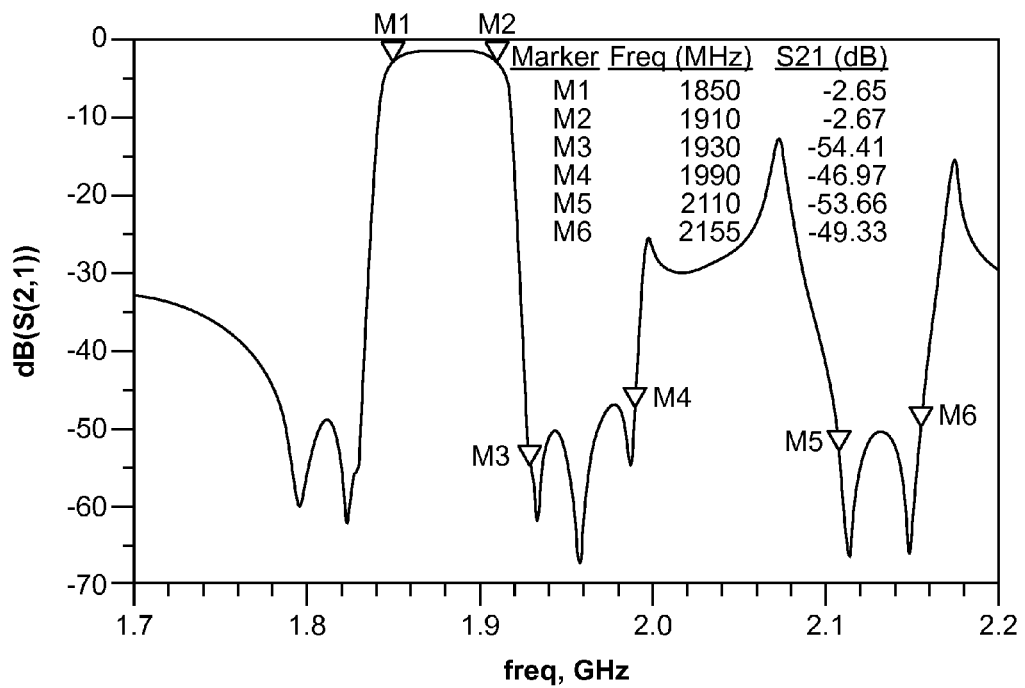
FIG. 17 is a S21 frequency response plot of the pre-optimized filter circuit design of FIG. 15.

Notably, any B value can be realized by either an L or a C depending on the sign of B. Unmapping of the normalized circuit values yields the realized circuit shown in FIG. 15 along with the values of the resonant frequencies $\omega_R$ and static capacitances $C_0$ for each resonator, and the capacitances and inductances of the capacitors and inductors, as shown in FIG. 16, which when simulated, resulted in the frequency response illustrated in FIG. 17. (Note: the inductor L1 and the capacitor C1 are added at the end of the synthesis by pole extraction to provide equal input and output impedance of the network.)

Next, parasitic effects are added to the acoustic filter circuit design 150a using an electromagnetic simulator, such as Sonnet® Software, and adding busbar (interconnection) losses to arrive at a pre-optimized filter circuit design (step 68). The losses of the acoustic resonators may be included by associating a Q factor for the respective circuit elements. In this embodiment, the motional capacitance $C_m$ 124 has an associated Q defined as $Q_{cm}=10^8$; the static capacitance $C_0$ 126 has an associated Q defined as $Q_{c0}=200$; and motional inductance $L_m$ 128 has an associated Q defined as $Q_{Lm}=1000$. The remaining inductors have an associated Q defined as $Q_u=60$, and the remaining capacitors have an associated Q defined as $Q_u=200$. A busbar (interconnection) resistance of $R_S=0.5$ ohms is also added for each acoustic resonator.

Figure 18:
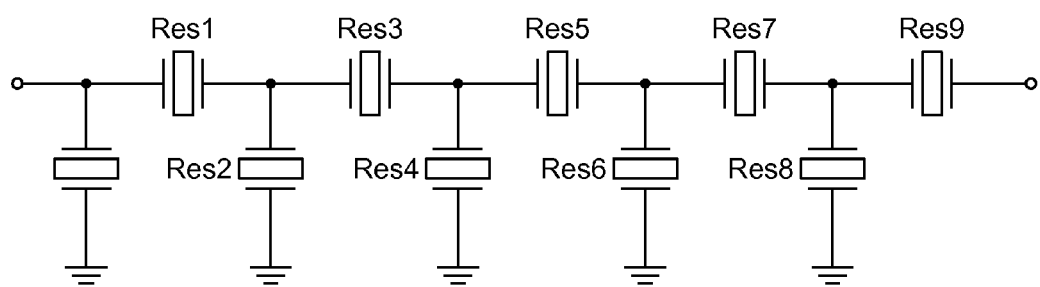
FIG. 18 is a schematic diagram of an optimized filter circuit design created by inputting the pre-optimized filter circuit design into a computerized filter optimizer and performing an element removal design technique in accordance with the network synthesis technique of FIG. 2.
Figure 20:
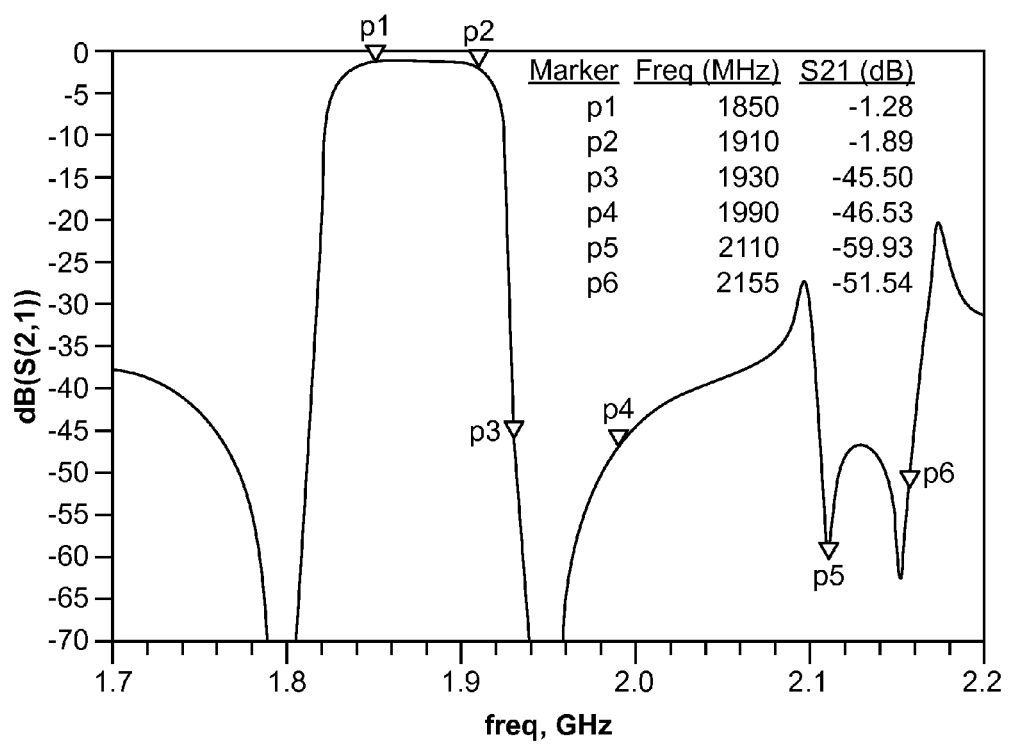
FIG. 20 is an S21 frequency response plot of the optimized filter circuit design of FIG. 18.

The pre-optimized filter circuit design is then input into a computerized filter optimizer to create a final filter circuit design (step 70). In an optional method, an element removal optimization (ERO) technique is implemented during the optimization, where unnecessary or "vanishing" circuit elements are removed or reduced to simpler circuit elements, resulting in the final filter circuit design illustrated in FIG. 18. The ERO technique is described in U.S. Provisional Patent Application Ser. No. 61/802,114, entitled "Element Removal Design in Microwave Filters," which is expressly incorporated herein by reference. The optimization and ERO technique resulted in resonant frequencies $\omega_R$ and static capacitances $C_0$ for each resonator, and capacitances of the capacitors, as shown in FIG. 19, which when simulated, resulted in the frequency response illustrated in FIG. 20, which meets the target frequency response requirements.

Notably, it is expected that multi-band filters designed in accordance with the network synthesis technique illustrated in FIG. 2 will have resonances and resonators with resonant frequencies spanning ranges that are relatively large in contrast to microwave acoustic filters designed in accordance with prior art image design techniques and simple extensions thereof.

For example, one measure to which the span of resonance frequencies of a filter or its resonators can be compared is the frequency separation of the resonator in the filter with the highest resonant frequency. For a 42-degree XY-cut LiTaO3 substrate, γ is greater than about 12. Any parasitic capacitance from the realization of the acoustic resonator may increase the γ and therefore decrease the percentage separation, while parasitic inductance may effectively decrease γ. In this example, for γ=12, the percentage separation is 4.0833%, and therefore, the separation of the resonator with the highest resonant frequency is about 88.1 MHz (i.e., a resonant frequency of 2151.57 MHz times the percent separation of 4.0833%). Another measure to which the span of resonance frequencies of a filter or its resonators can be compared is the average frequency separation of its resonators, in this case 77.32 MHz.

Figure 21A:
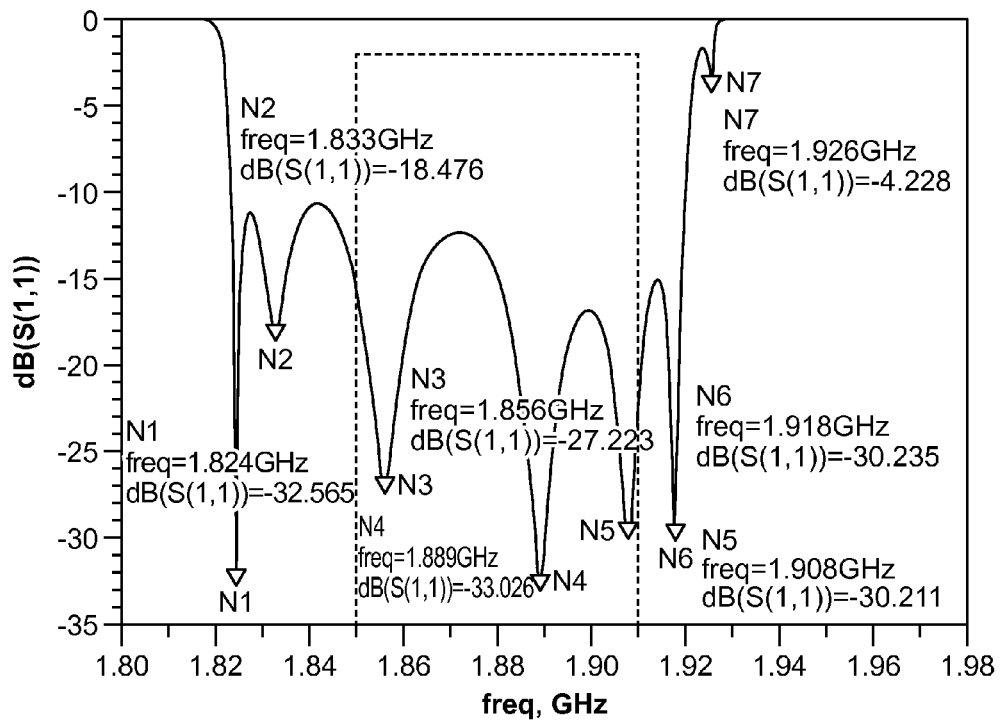
FIGS. 21a and 21b are S11 frequency response plots of the optimized filter circuit design of FIG. 18.
Figure 21B:
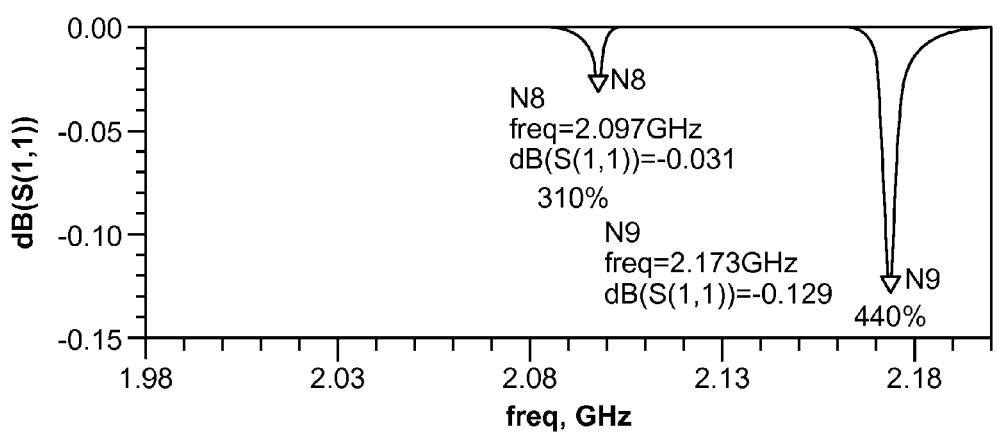

In contrast to the frequency separation of an acoustic resonator, the "frequency difference" between two acoustic resonators means the absolute frequency difference between the resonant frequencies of the two resonators, and the frequency difference between two resonances of a filter is the absolute frequency difference between the two resonances. FIGS. 21(a) and 21(b) show the return loss (S11) of the filter defined in FIGS. 18-19. Return loss minima correspond to resonances of the filter circuit and also correspond to reflection zeroes of the initial filter design. FIG. 21(a) shows the resonances of the filter primarily responsible for forming the filter passband, N1 through N7. The frequency difference between the highest and lowest resonance shown in FIG. 21(a) is 102 MHz or about 1.32 times the average frequency separation of the resonators. In addition, the frequency difference between the highest and lowest resonance of the combined FIGS. 21(a) and 21(b) is 349 MHz (2173-1824 MHz), or about 4.51 times the average frequency separation of the resonators, while the frequency difference between the highest and lowest frequency resonators in the filter is 459.37 MHz (2151.57–1892.2 MHz), or about 5.94 times the average frequency separation of the resonators.

Thus, it is expected that the difference between the lowest resonance frequency and the highest resonance frequency of the passband resonances in the final filter circuit design will be at least 1.25 times the average separation of the resonators.

It is expected that multi-band filters designed in accordance with the network synthesis technique illustrated in FIG. 2 will have resonators as well as resonances corresponding to reflection zeroes that are located relatively far from the passband in contrast to filters designed in accordance with prior art image design techniques, wherein the resonators and resonances corresponding to reflection zeroes are confined to the passband or very close to it.

In particular, resonances corresponding to reflection zeroes occur at frequencies where the local return loss (and/or S11) minima and local insertion loss (and/or S21) maxima coincide to within less than about five percent of the maximum frequency separation—less than about 4.405 MHz for this example. Alternatively, resonances corresponding to reflection zeroes occur at local minima and at local maxima of the delay of S11 (not shown). As can be seen from FIG. 21b, some resonances corresponding to reflection zeroes (in particular, the resonances corresponding to markers N1, N2, and N6-N9) are located outside and far from the passband (1850 MHz to 1910 MHz). The frequency difference between a resonance corresponding to a reflection zero and the nearest passband edge may be greater than once, perhaps greater than 1.25 times, and perhaps greater than twice, the maximum frequency separation (about 88.1 MHz in this example). In this particular example, reflection zeroes are located up to 3.40 times the average resonator separation (77.32 MHz) from the edge of the passband. Relative to the passband width (60 MHz), reflection zeroes N1, N2 are 43.33% and 28.33% below the lower edge of the passband, and reflection zeroes N6, N7 are 13.33% and 26.67% above the upper edge of the passband. Reflection zeroes N1, N2, N6, and N7 are contiguous with each other. Reflection zeroes N8, N9, which are not contiguous with the passband reflection zeroes N1, N2, N6, N7, are 311.67% and 438.33% above the upper edge of the passband. The insertion loss of the final filter circuit design is preferably less than 3 dB, and more preferably less than 2 dB.

Referring back to FIG. 2, once the final filter circuit design is achieved, an actual microwave filter is constructed based on the final filter circuit design (step 72). Preferably, the circuit element values of the actual microwave filter will match the corresponding circuit element values in the final filter circuit design.

Notably, a survey of different frequency responses may be analyzed and compared at various points in the network synthesis technique 50. In one embodiment, a survey of different frequency responses may be analyzed and compared based on different versions of the acoustic filter circuit design 150a generated at step 68 to arrive at a pre-optimized circuit design that is input into the computerized filter optimizer to create the final filter circuit design at step 70. For example, different acoustic resonator frequency orderings between input and output may be performed. In particular, the order in which the acoustic resonators are disposed along the signal transmission path may be changed to create multiple filter solutions, one or more performance parameters may be computed for each of the filter solutions, the performance(s) parameters for the different filter solutions can be compared to each other, and the best filter solution (and thus, ordering of the resonators) may be selected based on this comparison. This survey process may address all possible permutations of the ordering of the acoustic resonator frequencies in the real filter circuit design. The performance parameters may be, e.g., one or more of an insertion loss, return loss, rejection, group delay, node voltages, branch currents, either at specific or multiple frequencies in order to evaluate each circuit response against desired performance characteristics in the filter requirement. The survey process may yield quantitative or qualitative performance metric values indicating how a specific circuit may perform versus the filter requirement.

In other embodiments, the survey process may also address all realizable values of the static capacitances $C_0$ of the resonators, all permutations of positive (inductive) and or negative (capacitive) values (parities) of J-inverters, and other parameters that may be varied in the lossless design that may not change its response function, but may change the response of a realizable low-loss circuit. Further details discussing a survey process that reorders resonant frequencies is disclosed in U.S. Pat. No. 7,924,114, entitled "Electrical Filters with Improved Intermodulation Distortion," which is expressly incorporated herein by reference.

Although the filter requirements have been described in this embodiment as defining fixed passbands and stopbands, it should be appreciated that the filter requirements can define multiple reconfigurable passbands and/or stopband. For example, in one embodiment, the design may be reconfigurable between two states: a first state (called Band 5) that passes frequencies between 824 MHz and 849 MHz with less than 3.5 dB insertion loss and rejects frequencies between 869 MHz and 894 MHz by at least 40 dB; and a second state (called Band 8) that passes frequencies between 880 MHz and 915 MHz with less than 3.5 dB insertion loss and rejects frequencies between 925 MHz and 960 MHz by at least 40 dB (step 52). The circuit element type is selected as SAW resonators constructed on 15-degree Y-cut LiTaO3 substrates and capacitors integrated onto the 15-degree Y-cut LiTaO3 substrate (step 54).

Then, the initial filter circuit structure 100 illustrated in FIG. 3 is selected based on the passband(s) and/or stopband(s) obtained from the frequency response requirements (step 56). In this case, the number of resonators is six. Then, the frequency requirements are mapped into normalized space (step 58), a lossless circuit response is selected in the form of a polynomial ratio (step 60), and the mapped and normalized circuit element values in the initial filter circuit structure 100 are then calculated from these polynomials using a coupling matrix or parameter extraction methods or equivalent circuit synthesis techniques to create an initial filter circuit design (step 62).

Next, equivalent circuit transformations are performed on the initial filter circuit design 100 to accommodate acoustic resonators (step 64). In the same manner described above, the circuit transformation divides the initial filter circuit design 100 into multiple sub-set circuit designs equal to the number of resonating elements 114 (in this case, six), resulting in six shunt acoustic resonators.

Figure 22:
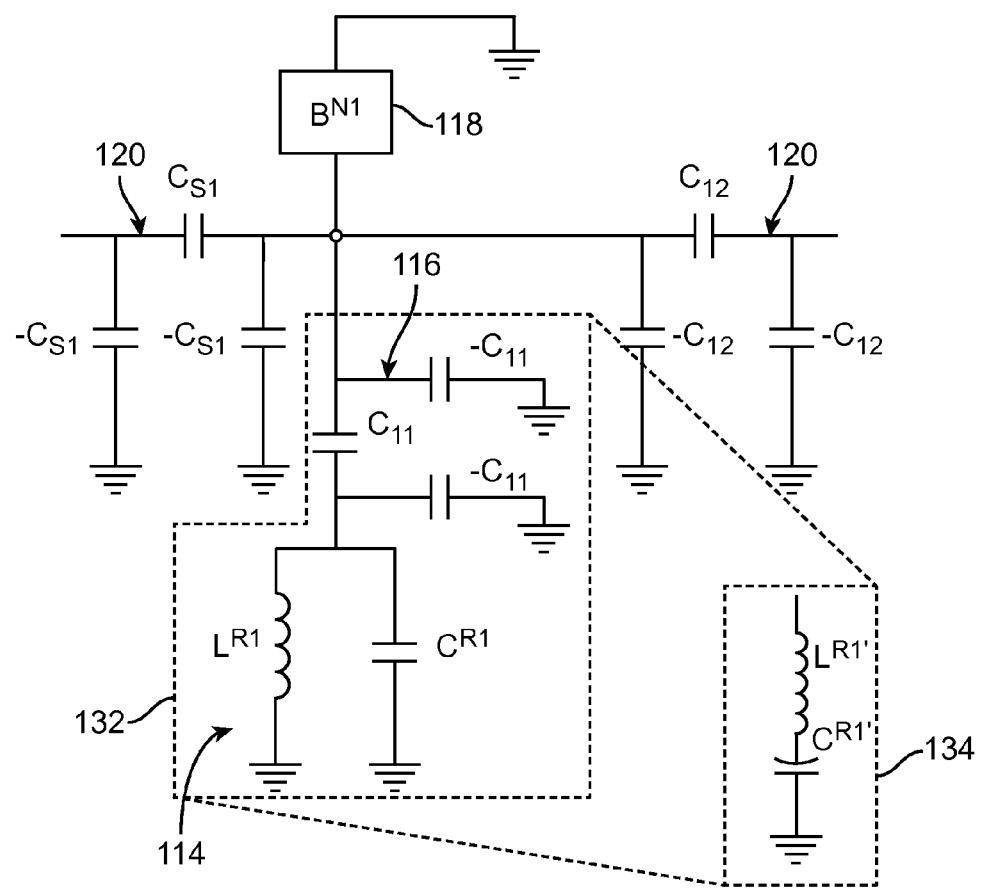
FIGS. 22-24 are circuit transformations sequentially made to the sub-set circuit design of FIG. 10 in accordance with the network synthesis technique of FIG. 2, whereby in-shunt acoustic resonators are incorporated into the resonant branches of the initial filter circuit design of FIG. 3.
Figure 23:
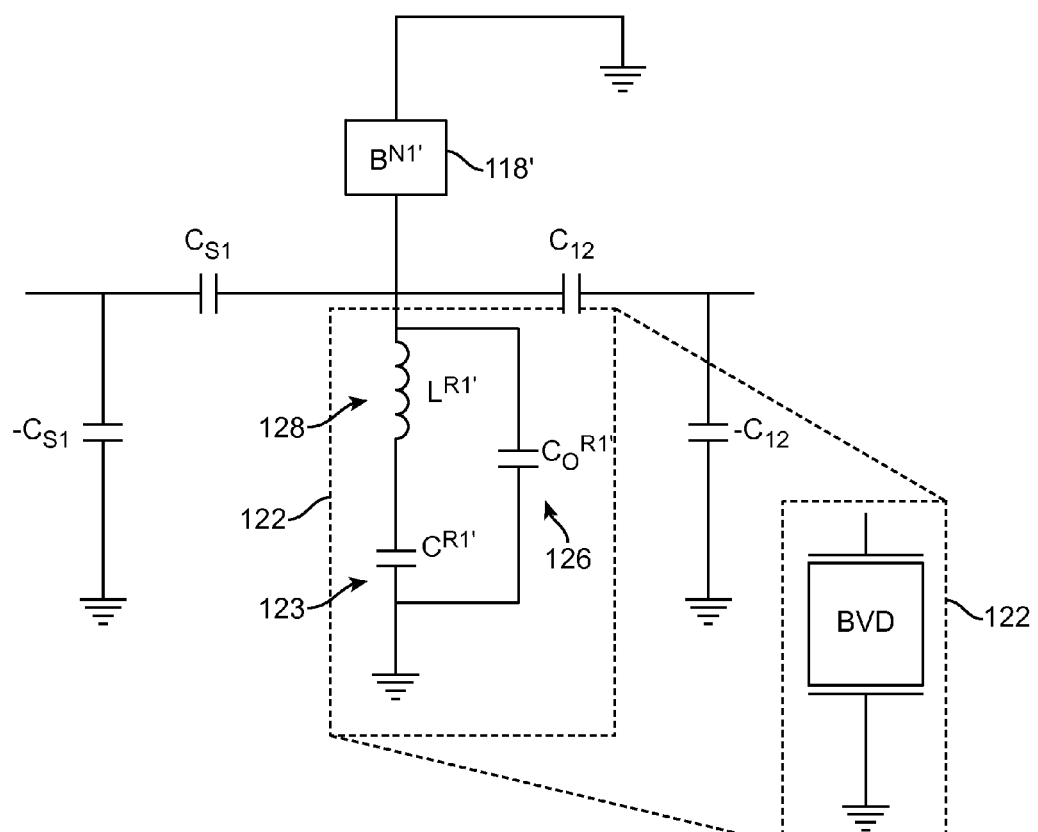
Figure 24:
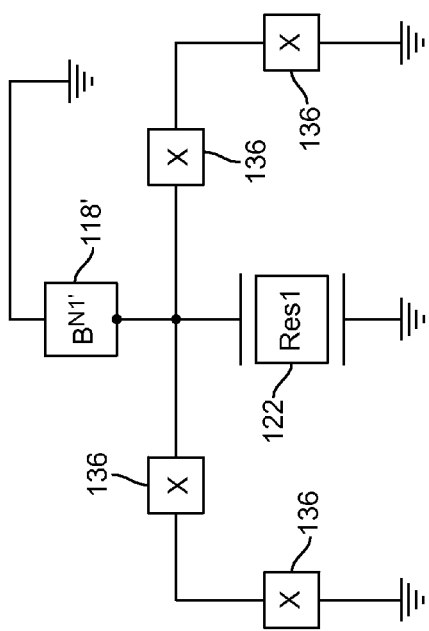
Figure 25:
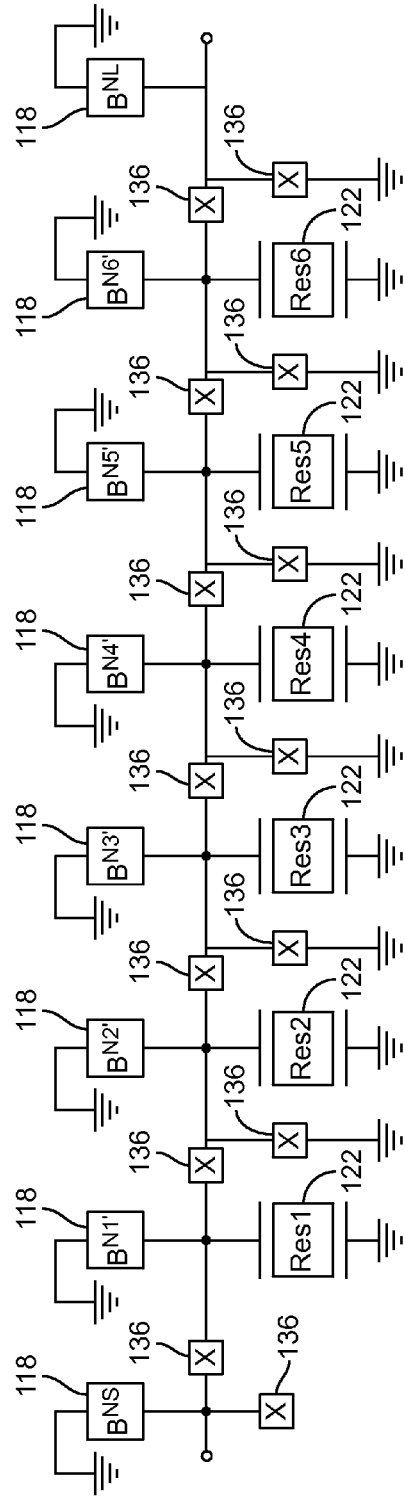
FIG. 25 is a schematic diagram of an acoustic filter circuit design generated from the sub-set acoustic circuit design of FIG. 24 in accordance with the network synthesis technique of FIG. 2.

In one transformation technique that incorporates an in-shunt acoustic resonator into the initial filter circuit design 100, the sub-set 130 illustrated in FIG. 6 can be transformed by replacing the admittance inverter $J_{S1}$ with a capacitive PI-network (capacitors $-C_{S1}$, $C_{S1}$, and $-C_{S1}$), the admittance inverter $J_{12}$ with a capacitive PI-network (capacitors $-C_{12}$, $C_{12}$, and $-C_{12}$), the admittance inverter $J_{11}$ with a capacitive PI-network (capacitors $-C_{11}$, $C_{11}$, and $-C_{11}$), and the resonating element $B_1^R$ with a parallel L-C resonator combination of an inductance (inductor $L^{R1}$) and a capacitance (capacitor $C^{R1}$), as illustrated in FIG. 22. In the same manner described above with respect to FIG. 7, the circuit sub-structure 132 represented by the PI-network consisting of capacitors $-C_{11}$, $C_{11}$, and $-C_{11}$ and the parallel L-C resonator combination of the inductor $L^{R1}$ and the capacitor $C^{R1}$ can be transformed into a series L-C combination 134 of an inductance (inductor $L^{R1'}$) and capacitance (capacitor $C^{R1'}$). In order to accommodate the static capacitance $C_0$ of the BVD model 122, the three adjacent parallel capacitances and susceptances ($-C_{S1}$, $-C_{12}$, and $B_1^N$) are replaced with a capacitance ($C_0^{R1'}$ and susceptance $B_1^{N'}$), as shown in FIG. 23. $C_0^{R1'}$ represents the static capacitance of the BVD model 122 and $B^{N1'}$ is given by the relationship $B^{N1} - \omega(C_{S1} + C_{12} + C_0^{R1})$. Thus, an in-shunt acoustic resonator 122 can be realized, as illustrated in FIG. 24. The other sub-sets 130 of the initial filter circuit design 100 can be transformed in the same manner to arrive at an acoustic filter circuit structure 150b having six in-shunt acoustic resonators 122, as illustrated in FIG. 25.

The circuit elements of the acoustic filter circuit structure 150b are then unmapped into real space (step 66), and parasitic effects are added to the acoustic filter circuit structure 150b to arrive at a pre-optimized circuit design (step 68). As discussed above, the losses of the circuit elements may be included by associating a Q factor for the respective circuit elements. In this embodiment, the motional capacitance $C_m$ to has an associated Q defined as $Q_{cm}=10^8$; the static capacitance $C_0$ has an associated Q defined as $Q_{c0}=140$; and motional inductance $L_m$ has an associated Q defined as $Q_{Lm}=3000$. The remaining inductors have an associated Q defined as $Q_u=60$, and the remaining capacitors have an associated Q defined as $Q_u=200$. A busbar (interconnection) resistance of $R_S=0.5$ ohms is also added for each acoustic resonator. In this embodiment, switch parasitics of 3 pF/(mm gate width) and 1.0 Ohm*(mm gate width) are also added.

Figure 26:
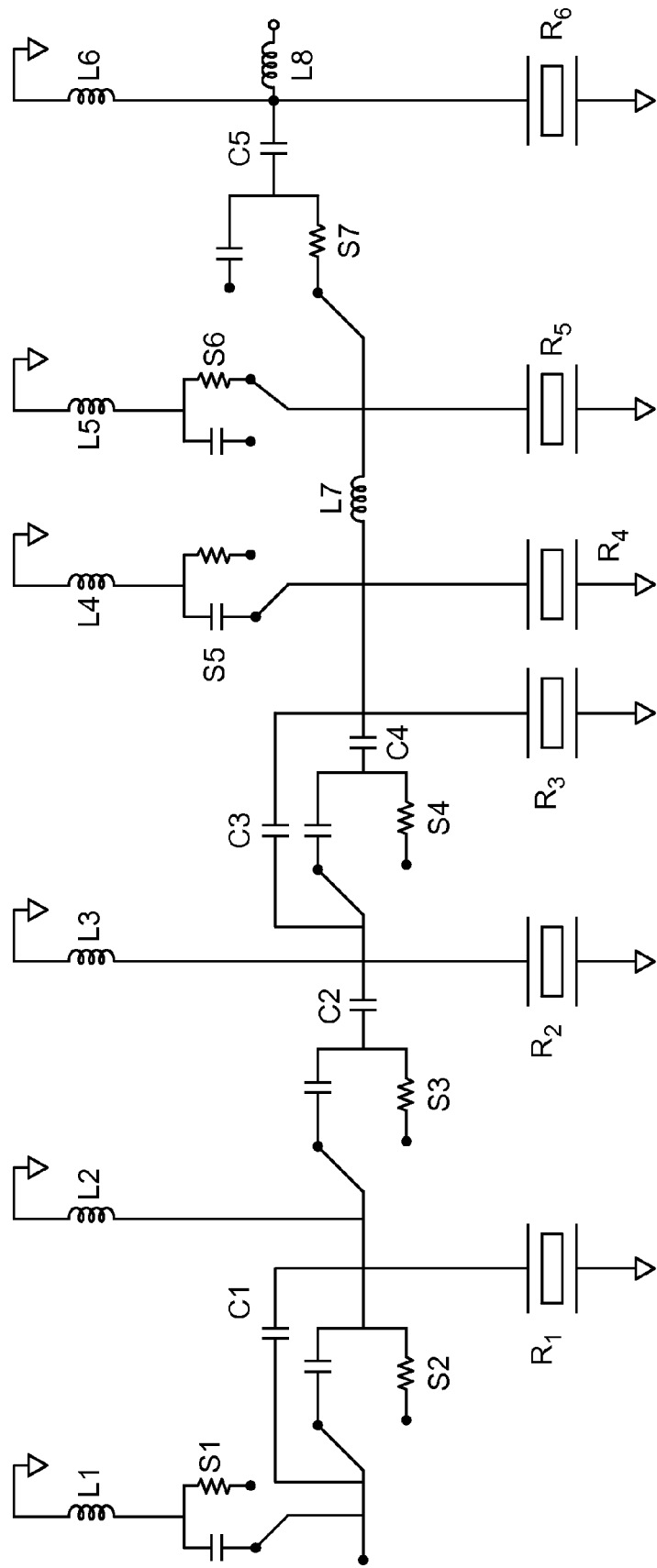
FIG. 26 is a schematic diagram of another pre-optimized filter circuit design realized from the acoustic filter circuit structure of FIG. 25 in accordance with the network synthesis technique of FIG. 2.

Next, the pre-optimized filter circuit design is input into a computer filter optimizer with the optional ERO technique to create a final circuit design (step 70). Prior to optimization, switches are added to each branch where the impedance is different between the two bands, thus, creating a single circuit from the two separate designs to be optimized, as illustrated in FIG. 26. The gate width of each switch, value of an inductor or capacitor (if needed), and the circuit configuration of the branch is selected, so that the impedance of a given branch will be the required band 5 impedance in one switch state and the required band 8 impedance in the other switch state. The ERO technique is then repeated on the combined circuit. The optimization process yields the resonant frequencies $\omega_R$ and static capacitances $C_0$ for each resonator, and the capacitances and inductances of the capacitors and inductors, as shown in FIG. 27, which when simulated, resulted in the frequency response for band 5 illustrated in FIG. 28 and the frequency response for band 8 illustrated in FIG. 29.

As previously discussed, a survey of different frequency responses may be analyzed and compared at various points in the network synthesis technique 50. In one embodiment, a survey of different frequency responses may be analyzed and compared based on different versions of the acoustic filter circuit design 150a generated at step 68 to arrive at a pre-optimized circuit design that is input into the computerized filter optimizer to create the final filter circuit design at step 70. For example, pairs of circuits (one band 5 and one band 8) are produced with each possible ordering of resonator frequencies, each possible parity of the J inverters (inductor or capacitive), and a selection of static capacitance $C_0$ values for the resonators. In this survey process, all possible permutations of resonator frequency orderings, all possible parities, a range of practical static capacitance $C_0$ values of 0.95, 1.9, 3.8, and 7.6 pF are used to calculate insertion loss at the passband center frequency for each design. One pair of designs (one band 5 and one band 8 with the same resonator order and static capacitance $C_0$ values) may then be selected.

Although the previous embodiment includes passbands and/or stopbands that are dynamically reconfigurable, it should be appreciated that a filter constructed in accordance with the network synthesis technique can have fixed passbands and/or stopbands that are reconfigurable prior to final completion of the filter, but be fixed after completion of the filter. For example, in one embodiment illustrated in FIG. 30, a lossless circuit model can be realized to create a filter having either a passband centered at either 836.5 MHz (Band 5) or 897.5 MHz (Band 8). This lossless circuit has been created by transforming the initial filter circuit design 100 illustrated in FIG. 3 using three SAW resonators.

In a transformation technique that incorporates three in-shunt acoustic resonators into the initial filter circuit design 100, the transformation technique illustrated in FIGS. 10-13 can be utilized to transform circuit sub-sets (each including a resonant element 114 (susceptance $B^R$) coupled from the respective node 108 to ground, a non-resonant element 116 (admittance inverter J) coupled in series with the resonant element 114, and a non-resonant element 118 (susceptance $B^N$) coupled from the respective node 108 to ground in parallel to the resonant element 114 (susceptance $B^R$)) into three in-shunt acoustic resonators. The circuit element type is selected as SAW resonators constructed on 42-degree Y-cut LiTaO3 substrates and capacitors integrated onto the 42-degree Y-cut LiTaO3 substrate.

Figure 30:
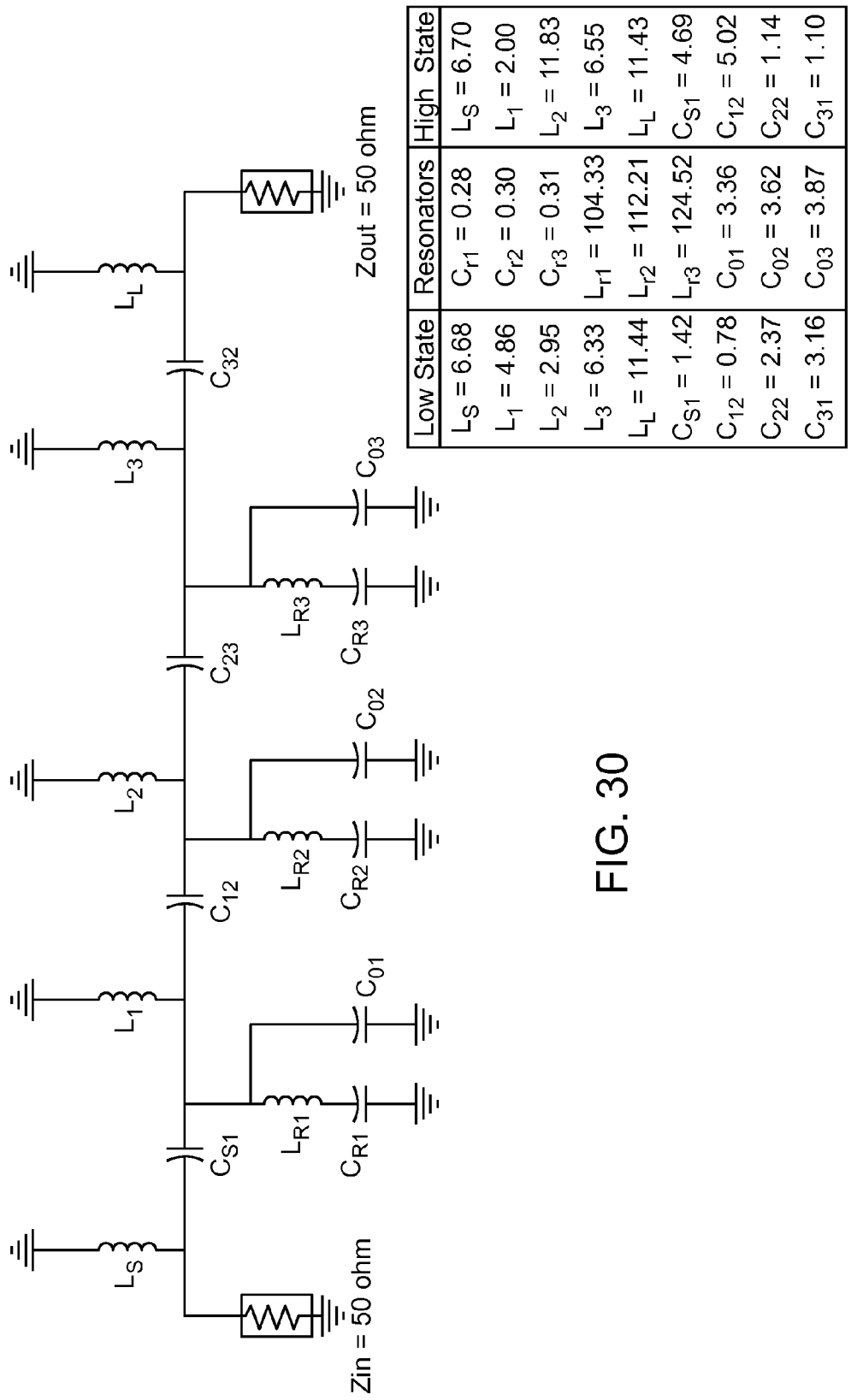
FIG. 30 is a schematic diagram of still another pre-optimized filter circuit design generated in accordance with the network synthesis technique of FIG. 2.
Figure 31:
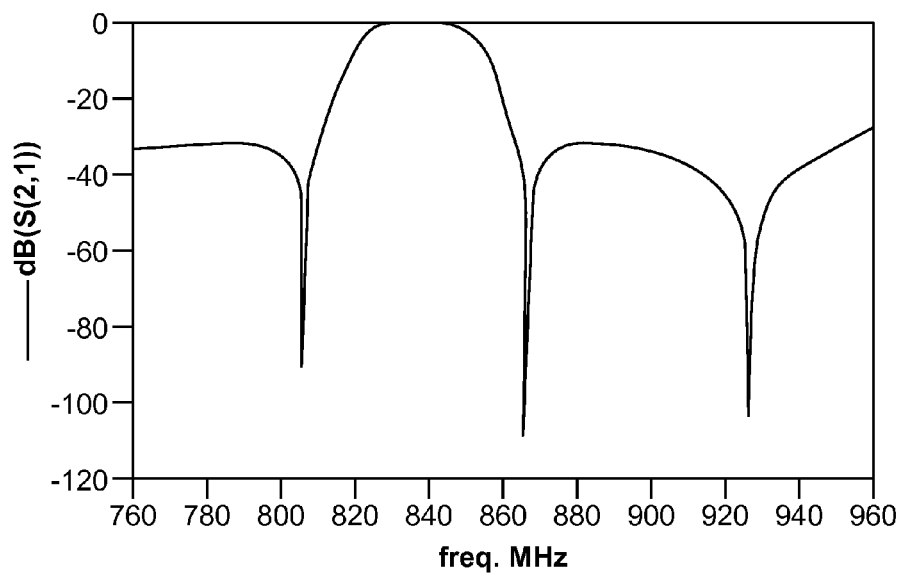
FIG. 31 is a S21 Band 5 frequency response plot of the filter circuit design of FIG. 30 after optimization.
Figure 32:
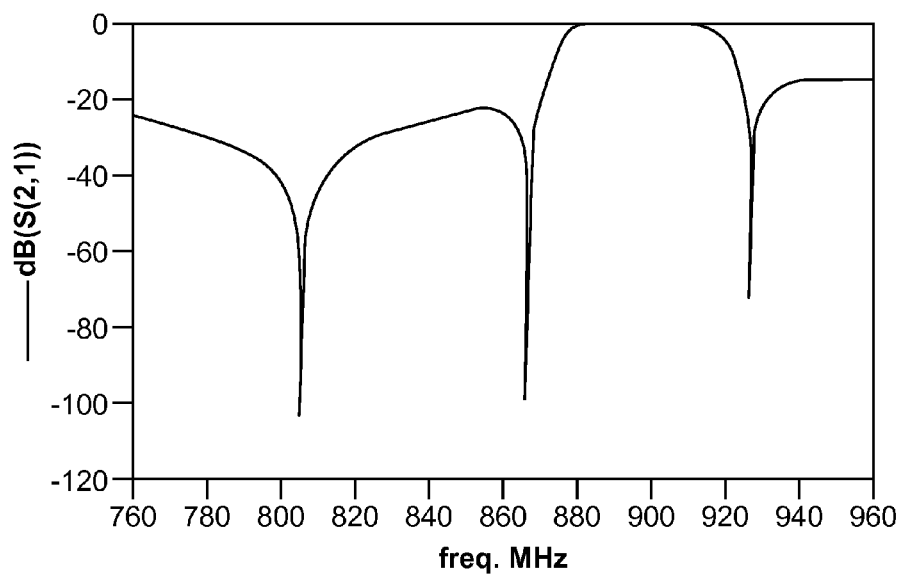
FIG. 32 is a S21 Band 8 frequency response plot of the filter circuit design of FIG. 30 after optimization.

The filter can be reconfigured prior to completion by altering the values of the series elements between the resonators (in this case, $C_{S1}$, $C_{12}$, $C_{23}$, $C_{3L}$) and the non-resonant shunt elements (in this case, $L_S$, $L_1$, $L_2$, $L_3$, $L_L$). The filter can then be constructed using either the values of the non-resonant elements for Band 5 or the values of the non-resonant elements for Band 8. The optimization process yields the static capacitances $C_0$ for each resonator, and the capacitances and inductances of the capacitors and inductors, as shown in FIG. 30, which when simulated, resulted in the frequency response for band 5 illustrated in FIG. 31 and the frequency response for band 8 illustrated in FIG. 32.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. A method of designing an acoustic microwave filter in accordance with frequency response requirements, comprising:
    selecting an initial filter circuit structure including a plurality of circuit elements comprising at least one resonant element and at least one other reactive circuit element;
    selecting lossless circuit response variables based on the frequency response requirements;
    selecting a value for each of the circuit elements based on the selected lossless circuit response variables to create an initial filter circuit design;
    transforming the at least one resonant element and the at least one other reactive circuit element of the initial filter circuit design into at least one acoustic resonator model to create an acoustic filter circuit design;
    adding parasitic effects to the acoustic filter circuit design to create a pre-optimized filter circuit design;
    optimizing the pre-optimized filter circuit design to create a final filter circuit design; and
    constructing the acoustic microwave filter based on the final filter circuit design.

2. The method of claim 1, wherein the frequency requirements comprises one or more of a frequency dependent return loss, insertion loss, rejection, and linearity.

3. The method of claim 1, wherein the frequency response requirements comprise a passband in 500-3500 MHz range.

4. The method of claim 1, wherein the frequency response requirements comprise a passband and a stopband.

5. The method of claim 1, wherein each of the at least one resonant element comprises a parallel L-C resonator combination of a capacitor and an inductor.

6. The method of claim 1, wherein the at least one other reactive circuit elements comprises a capacitor.

7. The method of claim 1, wherein the initial filter circuit structure is an in-line non-resonant-node circuit structure.

8. The method of claim 1, wherein the lossless circuit response variables are in the form of a ratio between numerator polynomials defining transmission zeroes and denominator polynomials defining reflection zeroes multiplied by a scale factor.

9. The method of claim 8, wherein the total number of transmission zeroes are equal to or greater than the total number of reflection zeroes.

10. The method of claim 1, wherein each of the at least one acoustic resonator model is a Butterworth-Van Dyke (BVD) model.

11. The method of claim 10, wherein one of the at least one resonator comprises an in-shunt parallel L-C resonator combination, one of the at least one other reactive circuit element comprises an in-shunt admittance inverter in series with the in-shunt parallel L-C resonator combination, and an in-shunt non-resonant susceptance in parallel with the in-shunt parallel L-C resonator combination, and wherein the in-shunt parallel L-C resonator combination, in-shunt admittance inverter, and in-shunt non-resonant susceptance are transformed into one of the at least one BVD model.

12. The method of claim 11, wherein the in-shunt parallel L-C resonator combination and the in-shunt admittance inverter are transformed into an in-shunt series L-C resonator combination, and the in-shunt series L-C resonator combination and in-shunt non-resonant susceptance are transformed into the one BVD model.

13. The method of claim 11, wherein the BVD model is an in-shunt BVD model.

14. The method of claim 13, wherein the at least one reactive circuit element further comprises two in-line admittance inverters coupled to a node between the in-shunt parallel L-C resonator combination and the in-shunt non-resonant susceptance, and wherein the in-shunt BVD model and the two in-line admittance inverters are transformed into an in-line BVD model and a reactance in series with the in-line BVD model.

15. The method of claim 1, wherein the at least one resonant element comprises a plurality of resonant elements, the at least one other reactive circuit elements comprises a plurality of reactive circuit elements, and the at least one acoustic resonator model comprises a plurality of resonator models.

16. The method of claim 15, further comprising dividing the initial filter circuit design into a plurality of sub-set circuit designs, each of which includes one of the resonant elements and one or more of the plurality of reactive circuit elements, wherein, for each sub-set circuit design, the resonant element and the one or more reactive circuit elements are transformed into a respective one of the acoustic resonator models.

17. The method of claim 1, further comprising selecting the structural type of each of the at least one resonant element from one of a surface acoustic wave (SAW) resonator, a bulk acoustic wave (BAW) resonator, a film bulk acoustic resonator (FBAR), and a microelectromechanical system (MEMS) resonator.

18. The method of claim 1, further comprising:
mapping the frequency response requirements to a normalized design space, wherein the circuit element values are normalized values that are determined based on the mapped frequency response requirements; and
unmapping the normalized circuit element values of the acoustic filter circuit design to a real design space.

19. The method of claim 1, wherein the at least one resonant element comprises a plurality of resonant elements.

20. The method of claim 19,
changing the order in which the plurality of resonant elements in the pre-optimized filter circuit design are disposed along a signal transmission path to create a plurality of filter solutions;
computing a performance parameter for each of the filter solutions;
comparing the performance parameters to each other; and
selecting one of the filter solutions as the pre-optimized circuit design based on the comparison of the computed performance parameters.

21. The method of claim 1, further comprising performing an element removal optimization of the pre-optimized filter circuit design to create the final filter circuit design.

22. The method of claim 1, wherein the final circuit design comprises a plurality of acoustic resonators, and wherein the difference between the lowest resonant frequency and the highest resonant frequency of the plurality of acoustic resonators in the final filter circuit design is at least one time the maximum frequency separation of a single resonator in the plurality of acoustic resonators.

23. The method of claim 22, wherein the difference between the lowest resonant frequency and the highest resonant frequency of a plurality of resonators in the final filter circuit design is at least two times the maximum frequency separation of a single resonator in the plurality of resonators.

24. The method of claim 22, wherein the difference between the lowest resonant frequency and the highest resonant frequency of a plurality of resonators in the final filter circuit design is at least three times the maximum frequency separation of a single resonator in the plurality of resonators.

25. The method of claim 1, wherein optimizing the pre-optimized filter circuit design comprises inputting the pre-optimized filter circuit design into a filter optimizer to create the final filter circuit design.

\* \* \* \* \*